US009269438B2

(12) United States Patent
Nachimuthu et al.

(10) Patent No.: US 9,269,438 B2
(45) Date of Patent: Feb. 23, 2016

(54) SYSTEM AND METHOD FOR INTELLIGENTLY FLUSHING DATA FROM A PROCESSOR INTO A MEMORY SUBSYSTEM

(75) Inventors: Murugasamy K Nachimuthu, Beaverton, OR (US); Mohan J Kumar, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 13/994,723

(22) PCT Filed: Dec. 21, 2011

(86) PCT No.: PCT/US2011/066492
§ 371 (c)(1),
(2), (4) Date: Oct. 21, 2013

(87) PCT Pub. No.: WO2013/095437
PCT Pub. Date: Jun. 27, 2013

(65) Prior Publication Data
US 2014/0297919 A1    Oct. 2, 2014

(51) Int. Cl.
*G11C 14/00* (2006.01)
*G06F 9/30* (2006.01)
*G06F 12/08* (2006.01)
*G11C 13/00* (2006.01)

(52) U.S. Cl.
CPC .......... *G11C 14/009* (2013.01); *G06F 12/0891* (2013.01); *G06F 9/30047* (2013.01); *G06F 12/0804* (2013.01); *G06F 12/0868* (2013.01); *G11C 13/0004* (2013.01)

(58) Field of Classification Search
CPC ............ G06F 9/30047; G06F 12/0804; G06F 12/0868; G06F 12/0891
See application file for complete search history.

(56) References Cited

U.S. PATENT DOCUMENTS

| 7,752,173 | B1* | 7/2010 | Gole | 707/654 |
| 2006/0143397 | A1* | 6/2006 | O'Bleness et al. | 711/135 |
| 2009/0222627 | A1* | 9/2009 | Reid | 711/135 |
| 2010/0185820 | A1 | 7/2010 | Hughes et al. | |
| 2011/0107049 | A1* | 5/2011 | Kwon et al. | 711/165 |

OTHER PUBLICATIONS

PCT/US2011/066492 Notification Concerning Transmittal of International Preliminary Report on Patentability, mailed Jul. 3, 2014, 8 pages.
PCT/US2011/066492 Notification of Transmittal of the International Search Report and the Written Opinion of the International Searching Authority, or the Declaration, Mailed Jul. 24, 2012, 11 pages.

* cited by examiner

*Primary Examiner* — Ryan Bertram
(74) *Attorney, Agent, or Firm* — Blakely, Sokoloff, Taylor & Zafman LLP

(57) ABSTRACT

A system and method are described for intelligently flushing data from a processor cache. For example, a system according to one embodiment of the invention comprises: a processor having a cache from which data is flushed, the data associated with a particular system address range; and a PCM memory controller for managing access to data stored in a PCM memory device corresponding to the particular system address range; the processor determining whether memory flush hints are enabled for the specified system address range, wherein if memory flush hints are enabled for the specified system address range then the processor sending a memory flush hint to a PCM memory controller of the PCM memory device and wherein the PCM memory controller uses the memory flush hint to determine whether to save the flushed data to the PCM memory device.

31 Claims, 31 Drawing Sheets

SYSTEM AND METHOD FOR INTELLIGENTLY FLUSHING DATA FROM A PROCESSOR INTO A MEMORY SUBSYSTEM

CROSS-REFERENCE TO RELATED APPLICATION

This patent application is a U.S. National Phase Application under 35 U.S.C. §371 of International Application No. PCT/US2011/066492, filed Dec. 21, 2011, entitled SYSTEM AND METHOD FOR INTELLIGENTLY FLUSHING DATA FROM A PROCESSOR INTO A MEMORY SUBSYSTEM.

BACKGROUND

1. Field of the Invention

This invention relates generally to the field of computer systems. More particularly, the invention relates to an apparatus and method for implementing a multi-level memory hierarchy.

2. Description of the Related Art

A. Current Memory and Storage Configurations

One of the limiting factors for computer innovation today is memory and storage technology. In conventional computer systems, system memory (also known as main memory, primary memory, executable memory) is typically implemented by dynamic random access memory (DRAM). DRAM-based memory consumes power even when no memory reads or writes occur because it must constantly recharge internal capacitors. DRAM-based memory is volatile, which means data stored in DRAM memory is lost once the power is removed. Conventional computer systems also rely on multiple levels of caching to improve performance. A cache is a high speed memory positioned between the processor and system memory to service memory access requests faster than they could be serviced from system memory. Such caches are typically implemented with static random access memory (SRAM). Cache management protocols may be used to ensure that the most frequently accessed data and instructions are stored within one of the levels of cache, thereby reducing the number of memory access transactions and improving performance.

With respect to mass storage (also known as secondary storage or disk storage), conventional mass storage devices typically include magnetic media (e.g., hard disk drives), optical media (e.g., compact disc (CD) drive, digital versatile disc (DVD), etc.), holographic media, and/or mass-storage flash memory (e.g., solid state drives (SSDs), removable flash drives, etc.). Generally, these storage devices are considered Input/Output (I/O) devices because they are accessed by the processor through various I/O adapters that implement various I/O protocols. These I/O adapters and I/O protocols consume a significant amount of power and can have a significant impact on the die area and the form factor of the platform. Portable or mobile devices (e.g., laptops, netbooks, tablet computers, personal digital assistant (PDAs), portable media players, portable gaming devices, digital cameras, mobile phones, smartphones, feature phones, etc.) that have limited battery life when not connected to a permanent power supply may include removable mass storage devices (e.g., Embedded Multimedia Card (eMMC), Secure Digital (SD) card) that are typically coupled to the processor via low-power interconnects and I/O controllers in order to meet active and idle power budgets.

With respect to firmware memory (such as boot memory (also known as BIOS flash)), a conventional computer system typically uses flash memory devices to store persistent system information that is read often but seldom (or never) written to. For example, the initial instructions executed by a processor to initialize key system components during a boot process (Basic Input and Output System (BIOS) images) are typically stored in a flash memory device. Flash memory devices that are currently available in the market generally have limited speed (e.g., 50 MHz). This speed is further reduced by the overhead for read protocols (e.g., 2.5 MHz). In order to speed up the BIOS execution speed, conventional processors generally cache a portion of BIOS code during the Pre-Extensible Firmware Interface (PEI) phase of the boot process. The size of the processor cache places a restriction on the size of the BIOS code used in the PEI phase (also known as the "PEI BIOS code").

B. Phase-Change Memory (PCM) and Related Technologies

Phase-change memory (PCM), also sometimes referred to as phase change random access memory (PRAM or PCRAM), PCME, Ovonic Unified Memory, or Chalcogenide RAM (C-RAM), is a type of non-volatile computer memory which exploits the unique behavior of chalcogenide glass. As a result of heat produced by the passage of an electric current, chalcogenide glass can be switched between two states: crystalline and amorphous. Recent versions of PCM can achieve two additional distinct states.

PCM provides higher performance than flash because the memory element of PCM can be switched more quickly, writing (changing individual bits to either 1 or 0) can be done without the need to first erase an entire block of cells, and degradation from writes is slower (a PCM device may survive approximately 100 million write cycles; PCM degradation is due to thermal expansion during programming, metal (and other material) migration, and other mechanisms).

BRIEF DESCRIPTION OF THE DRAWINGS

The following description and accompanying drawings are used to illustrate embodiments of the invention. In the drawings.

DETAILED DESCRIPTION

Figure 1:
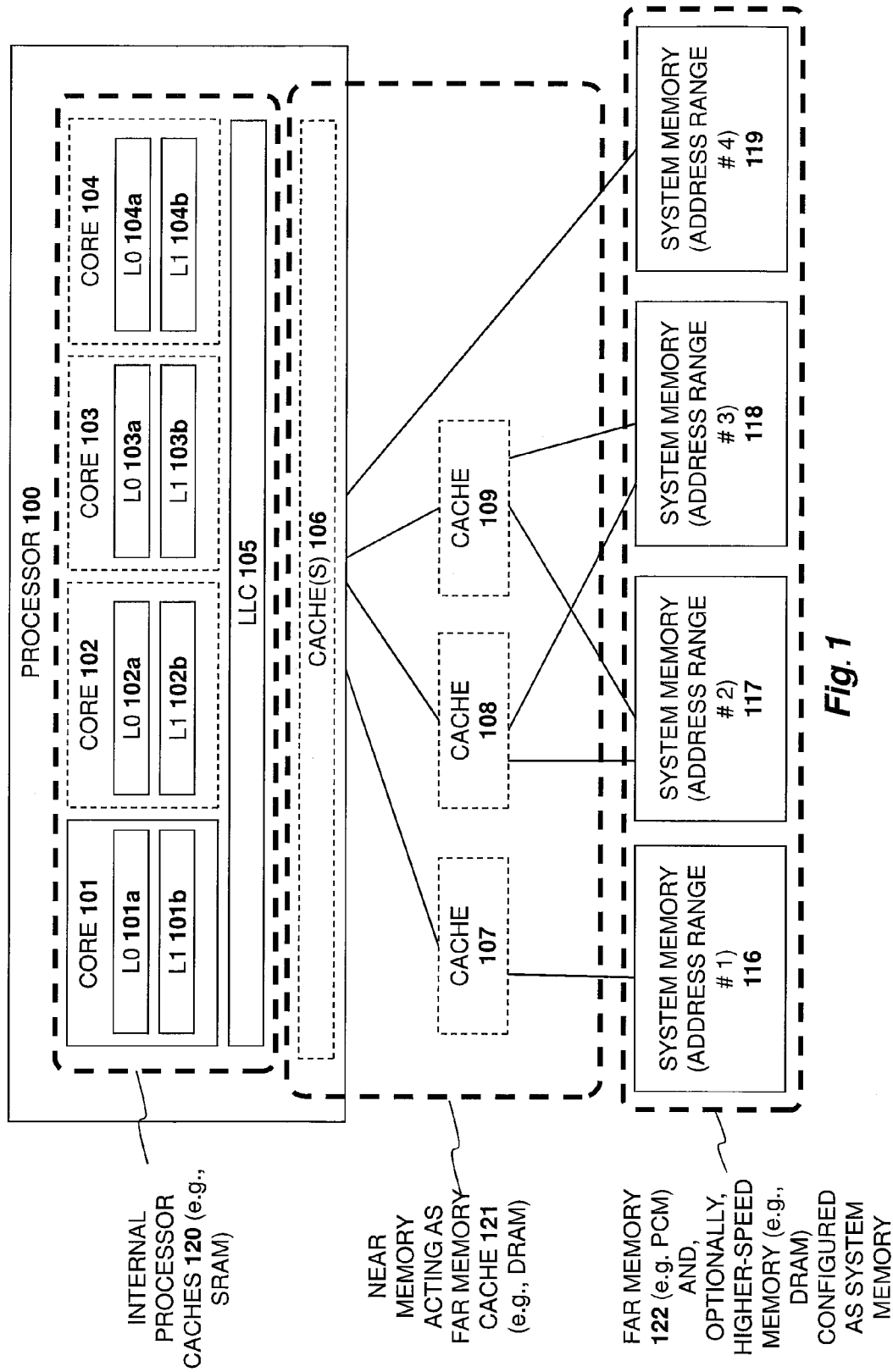
FIG. 1 illustrates a cache and system memory arrangement according to embodiments of the invention.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

Bracketed text and blocks with dashed borders (e.g., large dashes, small dashes, dot-dash, dots) are sometimes used herein to illustrate optional operations/components that add additional features to embodiments of the invention. However, such notation should not be taken to mean that these are the only options or optional operations/components, and/or that blocks with solid borders are not optional in certain embodiments of the invention.

Introduction

Memory capacity and performance requirements continue to increase with an increasing number of processor cores and new usage models such as virtualization. In addition, memory power and cost have become a significant component of the overall power and cost, respectively, of electronic systems.

Some embodiments of the invention solve the above challenges by intelligently subdividing the performance requirement and the capacity requirement between memory technologies. The focus of this approach is on providing performance with a relatively small amount of a relatively higher-speed memory such as DRAM while implementing the bulk of the system memory using significantly cheaper and denser non-volatile random access memory (NVRAM). Embodiments of the invention described below define platform configurations that enable hierarchical memory subsystem organizations for the use of NVRAM. The use of NVRAM in the memory hierarchy also enables new usages such as expanded boot space and mass storage implementations, as described in detail below.

FIG. 1 illustrates a cache and system memory arrangement according to embodiments of the invention. Specifically, FIG. 1 shows a memory hierarchy including a set of internal processor caches 120, "near memory" acting as a far memory cache 121, which may include both internal cache(s) 106 and external caches 107-109, and "far memory" 122. One particular type of memory which may be used for "far memory" in some embodiments of the invention is non-volatile random access memory ("NVRAM"). As such, an overview of NVRAM is provided below, followed by an overview of far memory and near memory.

A. Non-Volatile Random Access Memory ("NVRAM")

There are many possible technology choices for NVRAM, including PCM, Phase Change Memory and Switch (PCMS) (the latter being a more specific implementation of the former), byte-addressable persistent memory (BPRAM), universal memory, Ge2Sb2Te5, programmable metallization cell (PMC), resistive memory (RRAM), RESET (amorphous) cell, SET (crystalline) cell, PCME, Ovshinsky memory, ferroelectric memory (also known as polymer memory and poly(N-vinylcarbazole)), ferromagnetic memory (also known as Spintronics, SPRAM (spin-transfer torque RAM), STRAM (spin tunneling RAM), magnetoresistive memory, magnetic memory, magnetic random access memory (MRAM)), and Semiconductor-oxide-nitride-oxide-semiconductor (SONOS, also known as dielectric memory).

For use in the memory hierarchy described in this application, NVRAM has the following characteristics:

(1) It maintains its content even if power is removed, similar to FLASH memory used in solid state disks (SSD), and different from SRAM and DRAM which are volatile;

(2) lower power consumption when idle than volatile memories such as SRAM and DRAM;

(3) random access similar to SRAM and DRAM (also known as randomly addressable);

(4) rewritable and erasable at a lower level of granularity (e.g., byte level) than FLASH found in SSDs (which can only be rewritten and erased a "block" at a time—minimally 64 Kbyte in size for NOR FLASH and 16 Kbyte for NAND FLASH);

(5) usable as a system memory and allocated all or a portion of the system memory address space;

(6) capable of being coupled to the processor over a bus using a transactional protocol (a protocol that supports transaction identifiers (IDs) to distinguish different transactions so that those transactions can complete out-of-order) and allowing access at a level of granularity small enough to support operation of the NVRAM as system memory (e.g., cache line size such as 64 or 128 byte). For example, the bus may be a memory bus (e.g., a DDR bus such as DDR3, DDR4, etc.) over which is run a transactional protocol as opposed to the non-transactional protocol that is normally used. As another example, the bus may one over which is normally run a transactional protocol (a native transactional protocol), such as a PCI express (PCIE) bus, desktop management interface (DMI) bus, or any other type of bus utilizing a transactional protocol and a small enough transaction payload size (e.g., cache line size such as 64 or 128 byte); and (7) one or more of the following:
  a) faster write speed than non-volatile memory/storage technologies such as FLASH;
  b) very high read speed (faster than FLASH and near or equivalent to DRAM read speeds);
  c) directly writable (rather than requiring erasing (overwriting with 1s) before writing data like FLASH memory used in SSDs); and/or
  d) orders of magnitude (e.g., 2 or 3) higher write endurance before failure (more than boot ROM and FLASH used in SSDs).

As mentioned above, in contrast to FLASH memory, which must be rewritten and erased a complete "block" at a time, the level of granularity at which NVRAM is accessed in any given implementation may depend on the particular memory controller and the particular memory bus or other type of bus to which the NVRAM is coupled. For example, in some implementations where NVRAM is used as system memory, the NVRAM may be accessed at the granularity of a cache line (e.g., a 64-byte or 128-Byte cache line), notwithstanding an inherent ability to be accessed at the granularity of a byte, because cache line is the level at which the memory subsystem accesses memory. Thus, when NVRAM is deployed within a memory subsystem, it may be accessed at the same level of granularity as the DRAM (e.g., the "near memory") used in the same memory subsystem. Even so, the level of granularity of access to the NVRAM by the memory controller and memory bus or other type of bus is smaller than that of the block size used by Flash and the access size of the I/O subsystem's controller and bus.

NVRAM may also incorporate wear leveling algorithms to account for the fact that the storage cells at the far memory level begin to wear out after a number of write accesses, especially where a significant number of writes may occur such as in a system memory implementation. Since high cycle count blocks are most likely to wear out in this manner, wear leveling spreads writes across the far memory cells by swapping addresses of high cycle count blocks with low cycle count blocks. Note that most address swapping is typically transparent to application programs because it is handled by hardware, lower-level software (e.g., a low level driver or operating system), or a combination of the two.

B. Far Memory

The far memory 122 of some embodiments of the invention is implemented with NVRAM, but is not necessarily limited to any particular memory technology. Far memory 122 is distinguishable from other instruction and data memory/storage technologies in terms of its characteristics and/or its application in the memory/storage hierarchy. For example, far memory 122 is different from:

1) static random access memory (SRAM) which may be used for level 0 and level 1 internal processor caches 101a-b, 102a-b, 103a-b, 103a-b, and 104a-b dedicated to each of the processor cores 101-104, respectively, and lower level cache (LLC) 105 shared by the processor cores;

2) dynamic random access memory (DRAM) configured as a cache 106 internal to the processor 100 (e.g., on the same die as the processor 100) and/or configured as one or more caches 107-109 external to the processor (e.g., in the same or a different package from the processor 100); and 3) FLASH memory/magnetic disk/optical disc applied as mass storage (not shown); and 4) memory such as FLASH memory or other read only memory (ROM) applied as firmware memory (which can refer to boot ROM, BIOS Flash, and/or TPM Flash). (not shown).

Far memory 122 may be used as instruction and data storage that is directly addressable by a processor 100 and is able to sufficiently keep pace with the processor 100 in contrast to FLASH/magnetic disk/optical disc applied as mass storage. Moreover, as discussed above and described in detail below, far memory 122 may be placed on a memory bus and may communicate directly with a memory controller that, in turn, communicates directly with the processor 100.

Far memory 122 may be combined with other instruction and data storage technologies (e.g., DRAM) to form hybrid memories (also known as Co-locating PCM and DRAM; first level memory and second level memory; FLAM (FLASH and DRAM)). Note that at least some of the above technologies, including PCM/PCMS may be used for mass storage instead of, or in addition to, system memory, and need not be random accessible, byte addressable or directly addressable by the processor when applied in this manner.

For convenience of explanation, most of the remainder of the application will refer to "NVRAM" or, more specifically, "PCM," or "PCMS" as the technology selection for the far memory 122. As such, the terms NVRAM, PCM, PCMS, and far memory may be used interchangeably in the following discussion. However it should be realized, as discussed above, that different technologies may also be utilized for far memory. Also, that NVRAM is not limited for use as far memory.

C. Near Memory

"Near memory" 121 is an intermediate level of memory configured in front of a far memory 122 that has lower read/write access latency relative to far memory and/or more symmetric read/write access latency (i.e., having read times which are roughly equivalent to write times). In some embodiments, the near memory 121 has significantly lower write latency than the far memory 122 but similar (e.g., slightly lower or equal) read latency; for instance the near memory 121 may be a volatile memory such as volatile random access memory (VRAM) and may comprise a DRAM or other high speed capacitor-based memory. Note, however, that the underlying principles of the invention are not limited to these specific memory types. Additionally, the near memory 121 may have a relatively lower density and/or may be more expensive to manufacture than the far memory 122.

In one embodiment, near memory 121 is configured between the far memory 122 and the internal processor caches 120. In some of the embodiments described below, near memory 121 is configured as one or more memory-side caches (MSCs) 107-109 to mask the performance and/or usage limitations of the far memory including, for example, read/write latency limitations and memory degradation limitations. In these implementations, the combination of the MSC 107-109 and far memory 122 operates at a performance level which approximates, is equivalent or exceeds a system which uses only DRAM as system memory. As discussed in detail below, although shown as a "cache" in FIG. 1, the near memory 121 may include modes in which it performs other roles, either in addition to, or in lieu of, performing the role of a cache.

Near memory 121 can be located on the processor die (as cache(s) 106) and/or located external to the processor die (as caches 107-109) (e.g., on a separate die located on the CPU package, located outside the CPU package with a high bandwidth link to the CPU package, for example, on a memory dual in-line memory module (DIMM), a riser/mezzanine, or a computer motherboard). The near memory 121 may be coupled in communicate with the processor 100 using a single or multiple high bandwidth links, such as DDR or other transactional high bandwidth links (as described in detail below).

An Exemplary System Memory Allocation Scheme

FIG. 1 illustrates how various levels of caches 101-109 are configured with respect to a system physical address (SPA) space 116-119 in embodiments of the invention. As mentioned, this embodiment comprises a processor 100 having one or more cores 101-104, with each core having its own dedicated upper level cache (L0) 101a-104a and mid-level cache (MLC) (L1) cache 101b-104b. The processor 100 also includes a shared LLC 105. The operation of these various cache levels are well understood and will not be described in detail here.

The caches 107-109 illustrated in FIG. 1 may be dedicated to a particular system memory address range or a set of non-contiguous address ranges. For example, cache 107 is dedicated to acting as an MSC for system memory address range #1 116 and caches 108 and 109 are dedicated to acting as MSCs for non-overlapping portions of system memory address ranges #2 117 and #3 118. The latter implementation may be used for systems in which the SPA space used by the processor 100 is interleaved into an address space used by the caches 107-109 (e.g., when configured as MSCs). In some embodiments, this latter address space is referred to as a memory channel address (MCA) space. In one embodiment, the internal caches 101a-106 perform caching operations for the entire SPA space.

System memory as used herein is memory which is visible to and/or directly addressable by software executed on the processor 100; while the cache memories 101a-109 may operate transparently to the software in the sense that they do not form a directly-addressable portion of the system address space, but the cores may also support execution of instructions to allow software to provide some control (configuration, policies, hints, etc.) to some or all of the cache(s). The subdivision of system memory into regions 116-119 may be performed manually as part of a system configuration process (e.g., by a system designer) and/or may be performed automatically by software.

In one embodiment, the system memory regions 116-119 are implemented using far memory (e.g., PCM) and, in some embodiments, near memory configured as system memory. System memory address range #4 represents an address range which is implemented using a higher speed memory such as DRAM which may be a near memory configured in a system memory mode (as opposed to a caching mode).

Figure 2:
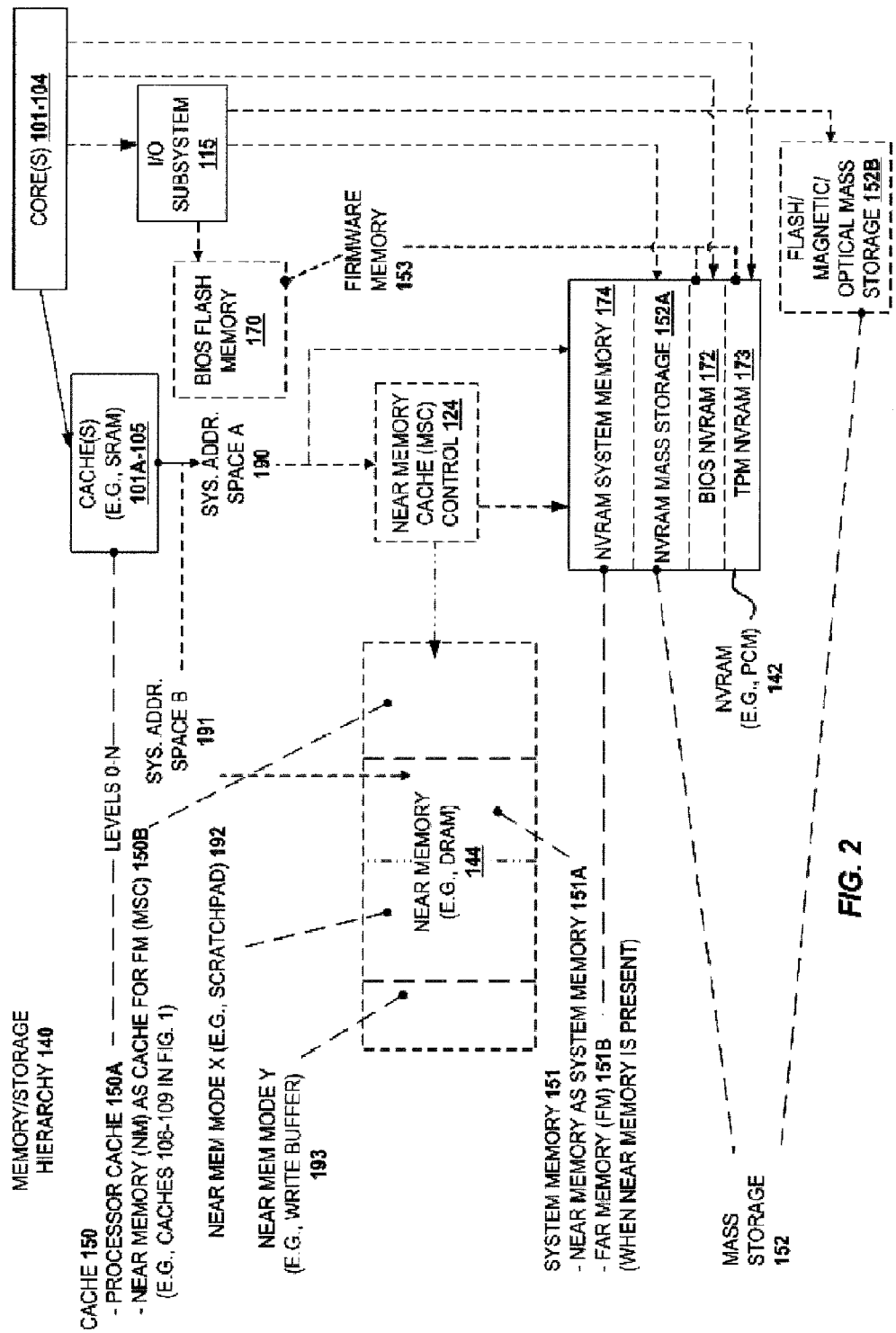
FIG. 2 illustrates a memory and storage hierarchy employed in embodiments of the invention.

FIG. 2 illustrates a memory/storage hierarchy 140 and different configurable modes of operation for near memory 144 and NVRAM according to embodiments of the invention. The memory/storage hierarchy 140 has multiple levels including (1) a cache level 150 which may include processor caches 150A (e.g., caches 101A-105 in FIG. 1) and optionally near memory as cache for far memory 150B (in certain modes of operation as described herein), (2) a system memory level 151 which may include far memory 151B (e.g., NVRAM such as PCM) when near memory is present (or just NVRAM as system memory 174 when near memory is not present), and optionally near memory operating as system memory 151A (in certain modes of operation as described herein), (3) a mass storage level 152 which may include a flash/magnetic/optical mass storage 152B and/or NVRAM mass storage 152A (e.g., a portion of the NVRAM 142); and (4) a firmware memory level 153 that may include BIOS flash 170 and/or BIOS NVRAM 172 and optionally trusted platform module (TPM) NVRAM 173.

As indicated, near memory 144 may be implemented to operate in a variety of different modes including: a first mode in which it operates as a cache for far memory (near memory as cache for FM 150B); a second mode in which it operates as system memory 151A and occupies a portion of the SPA space (sometimes referred to as near memory "direct access" mode); and one or more additional modes of operation such as a scratchpad memory 192 or as a write buffer 193. In some embodiments of the invention, the near memory is partitionable, where each partition may concurrently operate in a different one of the supported modes; and different embodiments may support configuration of the partitions (e.g., sizes, modes) by hardware (e.g., fuses, pins), firmware, and/or software (e.g., through a set of programmable range registers within the MSC controller 124 within which, for example, may be stored different binary codes to identify each mode and partition).

System address space A 190 in FIG. 2 is used to illustrate operation when near memory is configured as a MSC for far memory 150B. In this configuration, system address space A 190 represents the entire system address space (and system address space B 191 does not exist). Alternatively, system address space B 191 is used to show an implementation when all or a portion of near memory is assigned a portion of the system address space. In this embodiment, system address space B 191 represents the range of the system address space assigned to the near memory 151A and system address space A 190 represents the range of the system address space assigned to NVRAM 174.

In addition, when acting as a cache for far memory 150B, the near memory 144 may operate in various sub-modes under the control of the MSC controller 124. In each of these modes, the near memory address space (NMA) is transparent to software in the sense that the near memory does not form a directly-addressable portion of the system address space. These modes include but are not limited to the following:

(1) Write-Back Caching Mode:

In this mode, all or portions of the near memory acting as a FM cache 150B is used as a cache for the NVRAM far memory (FM) 151B. While in write-back mode, every write operation is directed initially to the near memory as cache for FM 150B (assuming that the cache line to which the write is directed is present in the cache). A corresponding write operation is performed to update the NVRAM FM 151B only when the cache line within the near memory as cache for FM 150B is to be replaced by another cache line (in contrast to write-through mode described below in which each write operation is immediately propagated to the NVRAM FM 151B).

(2) Near Memory Bypass Mode:

In this mode all reads and writes bypass the NM acting as a FM cache 150B and go directly to the NVRAM FM 151B. Such a mode may be used, for example, when an application is not cache friendly or requires data to be committed to persistence at the granularity of a cache line. In one embodiment, the caching performed by the processor caches 150A and the NM acting as a FM cache 150B operate independently of one another. Consequently, data may be cached in the NM acting as a FM cache 150B which is not cached in the processor caches 150A (and which, in some cases, may not be permitted to be cached in the processor caches 150A) and vice versa. Thus, certain data which may be designated as "uncacheable" in the processor caches may be cached within the NM acting as a FM cache 150B.

(3) Near Memory Read-Cache Write Bypass Mode:

This is a variation of the above mode where read caching of the persistent data from NVRAM FM 151B is allowed (i.e., the persistent data is cached in the near memory as cache for far memory 150B for read-only operations). This is useful when most of the persistent data is "Read-Only" and the application usage is cache-friendly.

(4) Near Memory Read-Cache Write-Through Mode:

This is a variation of the near memory read-cache write bypass mode, where in addition to read caching, write-hits are also cached. Every write to the near memory as cache for FM 150B causes a write to the FM 151B. Thus, due to the write-through nature of the cache, cache-line persistence is still guaranteed.

When acting in near memory direct access mode, all or portions of the near memory as system memory 151A are directly visible to software and form part of the SPA space. Such memory may be completely under software control. Such a scheme may create a non-uniform memory address (NUMA) memory domain for software where it gets higher performance from near memory 144 relative to NVRAM system memory 174. By way of example, and not limitation, such a usage may be employed for certain high performance computing (HPC) and graphics applications which require very fast access to certain data structures.

In an alternate embodiment, the near memory direct access mode is implemented by "pinning" certain cache lines in near memory (i.e., cache lines which have data that is also concurrently stored in NVRAM 142). Such pinning may be done effectively in larger, multi-way, set-associative caches.

FIG. 2 also illustrates that a portion of the NVRAM 142 may be used as firmware memory. For example, the BIOS NVRAM 172 portion may be used to store BIOS images (instead of or in addition to storing the BIOS information in BIOS flash 170). The BIOS NVRAM portion 172 may be a portion of the SPA space and is directly addressable by software executed on the processor cores 101-104, whereas the BIOS flash 170 is addressable through the I/O subsystem 115. As another example, a trusted platform module (TPM) NVRAM 173 portion may be used to protect sensitive system information (e.g., encryption keys).

Thus, as indicated, the NVRAM 142 may be implemented to operate in a variety of different modes, including as far memory 151B (e.g., when near memory 144 is present/operating, whether the near memory is acting as a cache for the FM via a MSC control 124 or not (accessed directly after cache(s) 101A-105 and without MSC control 124)); just NVRAM system memory 174 (not as far memory because there is no near memory present/operating; and accessed without MSC control 124); NVRAM mass storage 152A; BIOS NVRAM 172; and TPM NVRAM 173. While different embodiments may specify the NVRAM modes in different ways, FIG. 3 describes the use of a decode table 333.

Figure 3:
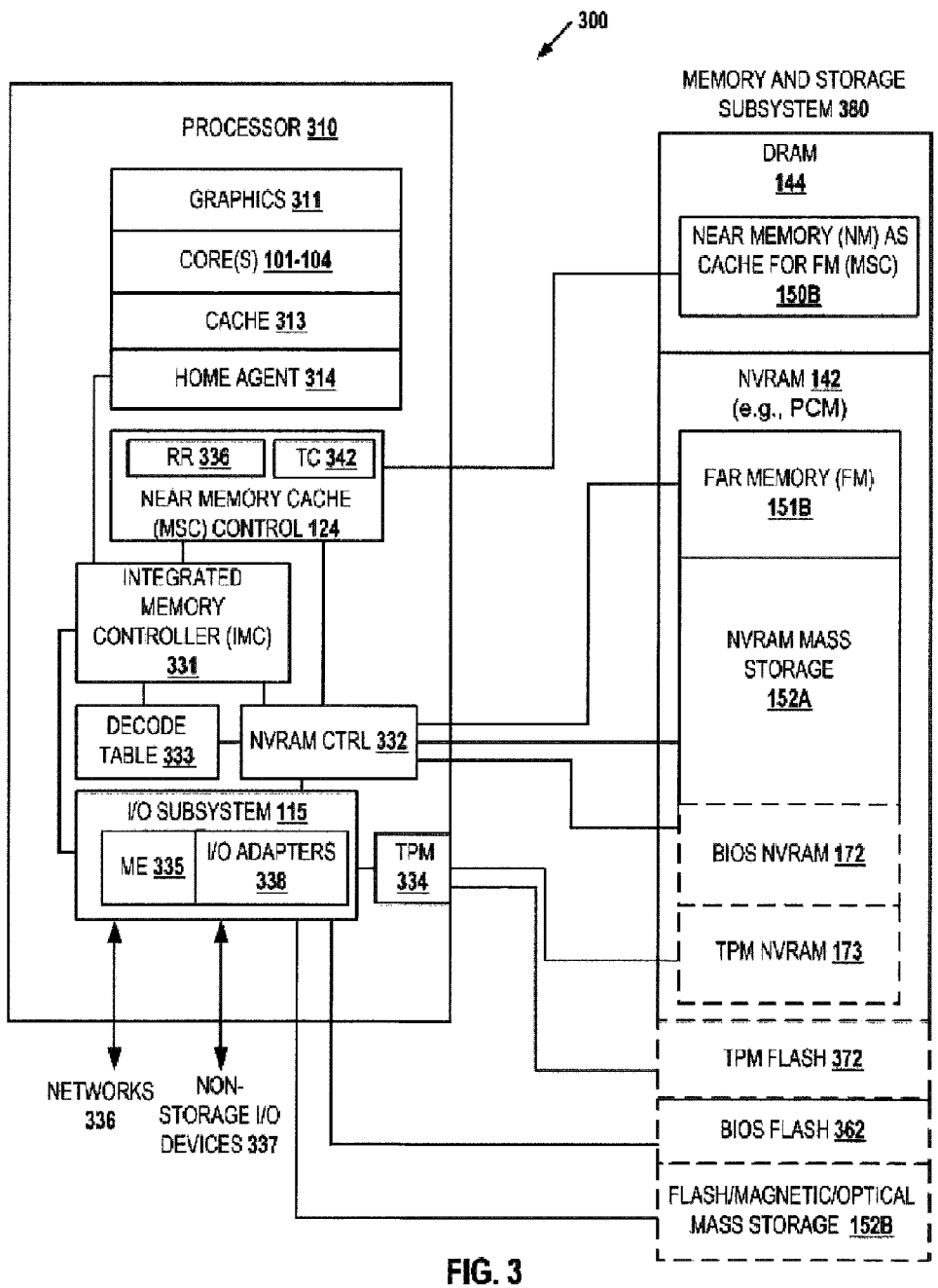
FIG. 3 illustrates a computer system on which embodiments of the invention may be implemented.

FIG. 3 illustrates an exemplary computer system 300 on which embodiments of the invention may be implemented. The computer system 300 includes a processor 310 and memory/storage subsystem 380 with a NVRAM 142 used for both system memory, mass storage, and optionally firmware memory. In one embodiment, the NVRAM 142 comprises the entire system memory and storage hierarchy used by computer system 300 for storing data, instructions, states, and other persistent and non-persistent information. As previously discussed, NVRAM 142 can be configured to implement the roles in a typical memory and storage hierarchy of system memory, mass storage, and firmware memory, TPM memory, and the like. In the embodiment of FIG. 3, NVRAM 142 is partitioned into FM 151B, NVRAM mass storage 152A, BIOS NVRAM 173, and TMP NVRAM 173. Storage hierarchies with different roles are also contemplated and the application of NVRAM 142 is not limited to the roles described above.

By way of example, operation while the near memory as cache for FM 150B is in the write-back caching is described. In one embodiment, while the near memory as cache for FM 150B is in the write-back caching mode mentioned above, a read operation will first arrive at the MSC controller 124 which will perform a look-up to determine if the requested data is present in the near memory acting as a cache for FM 150B (e.g., utilizing a tag cache 342). If present, it will return the data to the requesting CPU, core 101-104 or I/O device through I/O subsystem 115. If the data is not present, the MSC controller 124 will send the request along with the system memory address to an NVRAM controller 332. The NVRAM controller 332 will use the decode table 333 to translate the system memory address to an NVRAM physical device address (PDA) and direct the read operation to this region of the far memory 151B. In one embodiment, the decode table 333 includes an address indirection table (AIT) component which the NVRAM controller 332 uses to translate between system memory addresses and NVRAM PDAs. In one embodiment, the AIT is updated as part of the wear leveling algorithm implemented to distribute memory access operations and thereby reduce wear on the NVRAM FM 151B. Alternatively, the AIT may be a separate table stored within the NVRAM controller 332.

Upon receiving the requested data from the NVRAM FM 151B, the NVRAM controller 332 will return the requested data to the MSC controller 124 which will store the data in the MSC near memory acting as an FM cache 150B and also send the data to the requesting processor core 101-104, or I/O Device through I/O subsystem 115. Subsequent requests for this data may be serviced directly from the near memory acting as a FM cache 150B until it is replaced by some other NVRAM FM data.

As mentioned, in one embodiment, a memory write operation also first goes to the MSC controller 124 which writes it into the MSC near memory acting as a FM cache 150B. In write-back caching mode, the data may not be sent directly to the NVRAM FM 151B when a write operation is received. For example, the data may be sent to the NVRAM FM 151B only when the location in the MSC near memory acting as a FM cache 150B in which the data is stored must be re-used for storing data for a different system memory address. When this happens, the MSC controller 124 notices that the data is not current in NVRAM FM 151B and will thus retrieve it from near memory acting as a FM cache 150B and send it to the NVRAM controller 332. The NVRAM controller 332 looks up the PDA for the system memory address and then writes the data to the NVRAM FM 151B.

In FIG. 3, the NVRAM controller 332 is shown connected to the FM 151B, NVRAM mass storage 152A, and BIOS NVRAM 172 using three separate lines. This does not necessarily mean, however, that there are three separate physical buses or communication channels connecting the NVRAM controller 332 to these portions of the NVRAM 142. Rather, in some embodiments, a common memory bus or other type of bus (such as those described below with respect to FIGS. 4A-M) is used to communicatively couple the NVRAM controller 332 to the FM 151B, NVRAM mass storage 152A, and BIOS NVRAM 172. For example, in one embodiment, the three lines in FIG. 3 represent a bus, such as a memory bus (e.g., a DDR3, DDR4, etc. bus), over which the NVRAM controller 332 implements a transactional protocol to communicate with the NVRAM 142. The NVRAM controller 332 may also communicate with the NVRAM 142 over a bus supporting a native transactional protocol such as a PCI express bus, desktop management interface (DMI) bus, or any other type of bus utilizing a transactional protocol and a small enough transaction payload size (e.g., cache line size such as 64 or 128 byte).

In one embodiment, computer system 300 includes integrated memory controller (IMC) 331 which performs the central memory access control for processor 310, which is coupled to: 1) a memory-side cache (MSC) controller 124 to control access to near memory (NM) acting as a far memory cache 150B; and 2) a NVRAM controller 332 to control access to NVRAM 142. Although illustrated as separate units in FIG. 3, the MSC controller 124 and NVRAM controller 332 may logically form part of the IMC 331.

In the illustrated embodiment, the MSC controller 124 includes a set of range registers 336 which specify the mode of operation in use for the NM acting as a far memory cache 150B (e.g., write-back caching mode, near memory bypass mode, etc., described above). In the illustrated embodiment, DRAM 144 is used as the memory technology for the NM acting as cache for far memory 150B. In response to a memory access request, the MSC controller 124 may determine (depending on the mode of operation specified in the range registers 336) whether the request can be serviced from the NM acting as cache for FM 150B or whether the request must be sent to the NVRAM controller 332, which may then service the request from the far memory (FM) portion 151B of the NVRAM 142.

In an embodiment where NVRAM 142 is implemented with PCMS, NVRAM controller 332 is a PCMS controller that performs access with protocols consistent with the PCMS technology. As previously discussed, the PCMS memory is inherently capable of being accessed at the granularity of a byte. Nonetheless, the NVRAM controller 332 may access a PCMS-based far memory 151B at a lower level of granularity such as a cache line (e.g., a 64-bit or 128-bit cache line) or any other level of granularity consistent with the memory subsystem. The underlying principles of the invention are not limited to any particular level of granularity for accessing a PCMS-based far memory 151B. In general, however, when PCMS-based far memory 151B is used to form part of the system address space, the level of granularity will be higher than that traditionally used for other non-volatile storage technologies such as FLASH, which can only perform rewrite and erase operations at the level of a "block" (minimally 64 Kbyte in size for NOR FLASH and 16 Kbyte for NAND FLASH).

In the illustrated embodiment, NVRAM controller 332 can read configuration data to establish the previously described modes, sizes, etc. for the NVRAM 142 from decode table 333, or alternatively, can rely on the decoding results passed from IMC 331 and I/O subsystem 315. For example, at either manufacturing time or in the field, computer system 300 can program decode table 333 to mark different regions of NVRAM 142 as system memory, mass storage exposed via SATA interfaces, mass storage exposed via USB Bulk Only Transport (BOT) interfaces, encrypted storage that supports TPM storage, among others. The means by which access is steered to different partitions of NVRAM device 142 is via a decode logic. For example, in one embodiment, the address range of each partition is defined in the decode table 333. In one embodiment, when IMC 331 receives an access request, the target address of the request is decoded to reveal whether the request is directed toward memory, NVRAM mass storage, or I/O. If it is a memory request, IMC 331 and/or the MSC controller 124 further determines from the target address whether the request is directed to NM as cache for FM 150B or to FM 151B. For FM 151B access, the request is forwarded to NVRAM controller 332. IMC 331 passes the request to the I/O subsystem 115 if this request is directed to I/O (e.g., non-storage and storage I/O devices). I/O subsystem 115 further decodes the address to determine whether the address points to NVRAM mass storage 152A, BIOS NVRAM 172, or other non-storage or storage I/P devices. If this address points to NVRAM mass storage 152A or BIOS NVRAM 172, I/O subsystem 115 forwards the request to NVRAM controller 332. If this address points to TMP NVRAM 173, I/O subsystem 115 passes the request to TPM 334 to perform secured access.

In one embodiment, each request forwarded to NVRAM controller 332 is accompanied with an attribute (also known as a "transaction type") to indicate the type of access. In one embodiment, NVRAM controller 332 may emulate the access protocol for the requested access type, such that the rest of the platform remains unaware of the multiple roles performed by NVRAM 142 in the memory and storage hierarchy. In alternative embodiments, NVRAM controller 332 may perform memory access to NVRAM 142 regardless of which transaction type it is. It is understood that the decode path can be different from what is described above. For example, IMC 331 may decode the target address of an access request and determine whether it is directed to NVRAM 142. If it is directed to NVRAM 142, IMC 331 generates an attribute according to decode table 333. Based on the attribute, IMC 331 then forwards the request to appropriate downstream logic (e.g., NVRAM controller 332 and I/O subsystem 315) to perform the requested data access. In yet another embodiment, NVRAM controller 332 may decode the target address if the corresponding attribute is not passed on from the upstream logic (e.g., IMC 331 and I/O subsystem 315). Other decode paths may also be implemented.

The presence of a new memory architecture such as described herein provides for a wealth of new possibilities. Although discussed at much greater length further below, some of these possibilities are quickly highlighted immediately below.

According to one possible implementation, NVRAM 142 acts as a total replacement or supplement for traditional DRAM technology in system memory. In one embodiment, NVRAM 142 represents the introduction of a second-level system memory (e.g., the system memory may be viewed as having a first level system memory comprising near memory as cache 150B (part of the DRAM device 340) and a second level system memory comprising far memory (FM) 151B (part of the NVRAM 142).

According to some embodiments, NVRAM 142 acts as a total replacement or supplement for the flash/magnetic/optical mass storage 152B. As previously described, in some embodiments, even though the NVRAM 152A is capable of byte-level addressability, NVRAM controller 332 may still access NVRAM mass storage 152A in blocks of multiple bytes, depending on the implementation (e.g., 64 Kbytes, 128 Kbytes, etc.). The specific manner in which data is accessed from NVRAM mass storage 152A by NVRAM controller 332 may be transparent to software executed by the processor 310. For example, even through NVRAM mass storage 152A may be accessed differently from Flash/magnetic/optical mass storage 152A, the operating system may still view NVRAM mass storage 152A as a standard mass storage device (e.g., a serial ATA hard drive or other standard form of mass storage device).

In an embodiment where NVRAM mass storage 152A acts as a total replacement for the flash/magnetic/optical mass storage 152B, it is not necessary to use storage drivers for block-addressable storage access. The removal of storage driver overhead from storage access can increase access speed and save power. In alternative embodiments where it is desired that NVRAM mass storage 152A appears to the OS and/or applications as block-accessible and indistinguishable from flash/magnetic/optical mass storage 152B, emulated storage drivers can be used to expose block-accessible interfaces (e.g., Universal Serial Bus (USB) Bulk-Only Transfer (BOT), 1.0; Serial Advanced Technology Attachment (SATA), 3.0; and the like) to the software for accessing NVRAM mass storage 152A.

In one embodiment, NVRAM 142 acts as a total replacement or supplement for firmware memory such as BIOS flash 362 and TPM flash 372 (illustrated with dotted lines in FIG. 3 to indicate that they are optional). For example, the NVRAM 142 may include a BIOS NVRAM 172 portion to supplement or replace the BIOS flash 362 and may include a TPM NVRAM 173 portion to supplement or replace the TPM flash 372. Firmware memory can also store system persistent states used by a TPM 334 to protect sensitive system information (e.g., encryption keys). In one embodiment, the use of NVRAM 142 for firmware memory removes the need for third party flash parts to store code and data that are critical to the system operations.

Continuing then with a discussion of the system of FIG. 3, in some embodiments, the architecture of computer system 100 may include multiple processors, although a single processor 310 is illustrated in FIG. 3 for simplicity. Processor 310 may be any type of data processor including a general purpose or special purpose central processing unit (CPU), an application-specific integrated circuit (ASIC) or a digital signal processor (DSP). For example, processor 310 may be a general-purpose processor, such as a Core™ i3, i5, i7, 2 Duo and Quad, Xeon™, or Itanium™ processor, all of which are available from Intel Corporation, of Santa Clara, Calif. Alternatively, processor 310 may be from another company, such as ARM Holdings, Ltd, of Sunnyvale, Calif., MIPS Technologies of Sunnyvale, Calif., etc. Processor 310 may be a special-purpose processor, such as, for example, a network or communication processor, compression engine, graphics processor, co-processor, embedded processor, or the like. Processor 310 may be implemented on one or more chips included within one or more packages. Processor 310 may be a part of and/or may be implemented on one or more substrates using any of a number of process technologies, such as, for example, BiCMOS, CMOS, or NMOS. In the embodiment shown in FIG. 3, processor 310 has a system-on-a-chip (SOC) configuration.

In one embodiment, the processor 310 includes an integrated graphics unit 311 which includes logic for executing graphics commands such as 3D or 2D graphics commands. While the embodiments of the invention are not limited to any particular integrated graphics unit 311, in one embodiment, the graphics unit 311 is capable of executing industry standard graphics commands such as those specified by the Open GL and/or Direct X application programming interfaces (APIs) (e.g., OpenGL 4.1 and Direct X 11).

The processor 310 may also include one or more cores 101-104, although a single core is illustrated in FIG. 3, again, for the sake of clarity. In many embodiments, the core(s) 101-104 includes internal functional blocks such as one or more execution units, retirement units, a set of general purpose and specific registers, etc. If the core(s) are multi-threaded or hyper-threaded, then each hardware thread may be considered as a "logical" core as well. The cores 101-104 may be homogenous or heterogeneous in terms of architecture and/or instruction set. For example, some of the cores may be in order while others are out-of-order. As another example, two or more of the cores may be capable of executing the same instruction set, while others may be capable of executing only a subset of that instruction set or a different instruction set.

The processor 310 may also include one or more caches, such as cache 313 which may be implemented as a SRAM and/or a DRAM. In many embodiments that are not shown, additional caches other than cache 313 are implemented so that multiple levels of cache exist between the execution units in the core(s) 101-104 and memory devices 150B and 151B. For example, the set of shared cache units may include an upper-level cache, such as a level 1 (L1) cache, mid-level caches, such as level 2 (L2), level 3 (L3), level 4 (L4), or other levels of cache, an (LLC), and/or different combinations thereof. In different embodiments, cache 313 may be apportioned in different ways and may be one of many different sizes in different embodiments. For example, cache 313 may be an 8 megabyte (MB) cache, a 16 MB cache, etc. Additionally, in different embodiments the cache may be a direct mapped cache, a fully associative cache, a multi-way set-associative cache, or a cache with another type of mapping. In other embodiments that include multiple cores, cache 313 may include one large portion shared among all cores or may be divided into several separately functional slices (e.g., one slice for each core). Cache 313 may also include one portion shared among all cores and several other portions that are separate functional slices per core.

The processor 310 may also include a home agent 314 which includes those components coordinating and operating core(s) 101-104. The home agent unit 314 may include, for example, a power control unit (PCU) and a display unit. The PCU may be or include logic and components needed for regulating the power state of the core(s) 101-104 and the integrated graphics unit 311. The display unit is for driving one or more externally connected displays.

As mentioned, in some embodiments, processor 310 includes an integrated memory controller (IMC) 331, near memory cache (MSC) controller, and NVRAM controller 332 all of which can be on the same chip as processor 310, or on a separate chip and/or package connected to processor 310. DRAM device 144 may be on the same chip or a different chip as the IMC 331 and MSC controller 124; thus, one chip may have processor 310 and DRAM device 144; one chip may have the processor 310 and another the DRAM device 144 and (these chips may be in the same or different packages); one chip may have the core(s) 101-104 and another the IMC 331, MSC controller 124 and DRAM 144 (these chips may be in the same or different packages); one chip may have the core(s) 101-104, another the IMC 331 and MSC controller 124, and another the DRAM 144 (these chips may be in the same or different packages); etc.

In some embodiments, processor 310 includes an I/O subsystem 115 coupled to IMC 331. I/O subsystem 115 enables communication between processor 310 and the following serial or parallel I/O devices: one or more networks 336 (such as a Local Area Network, Wide Area Network or the Internet), storage I/O device (such as flash/magnetic/optical mass storage 152B, BIOS flash 362, TPM flash 372) and one or more non-storage I/O devices 337 (such as display, keyboard, speaker, and the like). I/O subsystem 115 may include a platform controller hub (PCH) (not shown) that further includes several I/O adapters 338 and other I/O circuitry to provide access to the storage and non-storage I/O devices and networks. To accomplish this, I/O subsystem 115 may have at least one integrated I/O adapter 338 for each I/O protocol utilized. I/O subsystem 115 can be on the same chip as processor 310, or on a separate chip and/or package connected to processor 310.

I/O adapters 338 translate a host communication protocol utilized within the processor 310 to a protocol compatible with particular I/O devices. For flash/magnetic/optical mass storage 152B, some of the protocols that I/O adapters 338 may translate include Peripheral Component Interconnect (PCI)-Express (PCI-E), 3.0; USB, 3.0; SATA, 3.0; Small Computer System Interface (SCSI), Ultra-640; and Institute of Electrical and Electronics Engineers (IEEE) 1394 "Firewire;" among others. For BIOS flash 362, some of the protocols that I/O adapters 338 may translate include Serial Peripheral Interface (SPI), Microwire, among others. Additionally, there may be one or more wireless protocol I/O adapters. Examples of wireless protocols, among others, are used in personal area networks, such as IEEE 802.15 and Bluetooth, 4.0; wireless local area networks, such as IEEE 802.11-based wireless protocols; and cellular protocols.

In some embodiments, the I/O subsystem 115 is coupled to a TPM control 334 to control access to system persistent states, such as secure data, encryption keys, platform configuration information and the like. In one embodiment, these system persistent states are stored in a TMP NVRAM 173 and accessed via NVRAM controller 332

In one embodiment, TPM 334 is a secure micro-controller with cryptographic functionalities. TPM 334 has a number of trust-related capabilities; e.g., a SEAL capability for ensuring that data protected by a TPM is only available for the same TPM. TPM 334 can protect data and keys (e.g., secrets) using its encryption capabilities. In one embodiment, TPM 334 has a unique and secret RSA key, which allows it to authenticate hardware devices and platforms. For example, TPM 334 can verify that a system seeking access to data stored in computer system 300 is the expected system. TPM 334 is also capable of reporting the integrity of the platform (e.g., computer system 300). This allows an external resource (e.g., a server on a network) to determine the trustworthiness of the platform but does not prevent access to the platform by the user.

In some embodiments, I/O subsystem 315 also includes a Management Engine (ME) 335, which is a microprocessor that allows a system administrator to monitor, maintain, update, upgrade, and repair computer system 300. In one embodiment, a system administrator can remotely configure computer system 300 by editing the contents of the decode table 333 through ME 335 via networks 336.

For convenience of explanation, the remainder of the application sometimes refers to NVRAM 142 as a PCMS device. A PCMS device includes multi-layered (vertically stacked) PCM cell arrays that are non-volatile, have low power consumption, and are modifiable at the bit level. As such, the terms NVRAM device and PCMS device may be used interchangeably in the following discussion. However it should be realized, as discussed above, that different technologies besides PCMS may also be utilized for NVRAM 142.

It should be understood that a computer system can utilize NVRAM 142 for system memory, mass storage, firmware memory and/or other memory and storage purposes even if the processor of that computer system does not have all of the above-described components of processor 310, or has more components than processor 310.

In the particular embodiment shown in FIG. 3, the MSC controller 124 and NVRAM controller 332 are located on the same die or package (referred to as the CPU package) as the processor 310. In other embodiments, the MSC controller 124 and/or NVRAM controller 332 may be located off-die or off-CPU package, coupled to the processor 310 or CPU package over a bus such as a memory bus (like a DDR bus (e.g., a DDR3, DDR4, etc)), a PCI express bus, a desktop management interface (DMI) bus, or any other type of bus.

Exemplary PCM bus and packaging configurations

FIGS. 4A-M illustrates a variety of different deployments in which the processor, near memory and far memory are configured and packaged in different ways. In particular, the series of platform memory configurations illustrated in FIGS. 4A-M enable the use of new non-volatile system memory such as PCM technologies or, more specifically, PCMS technologies.

Figure 4A:
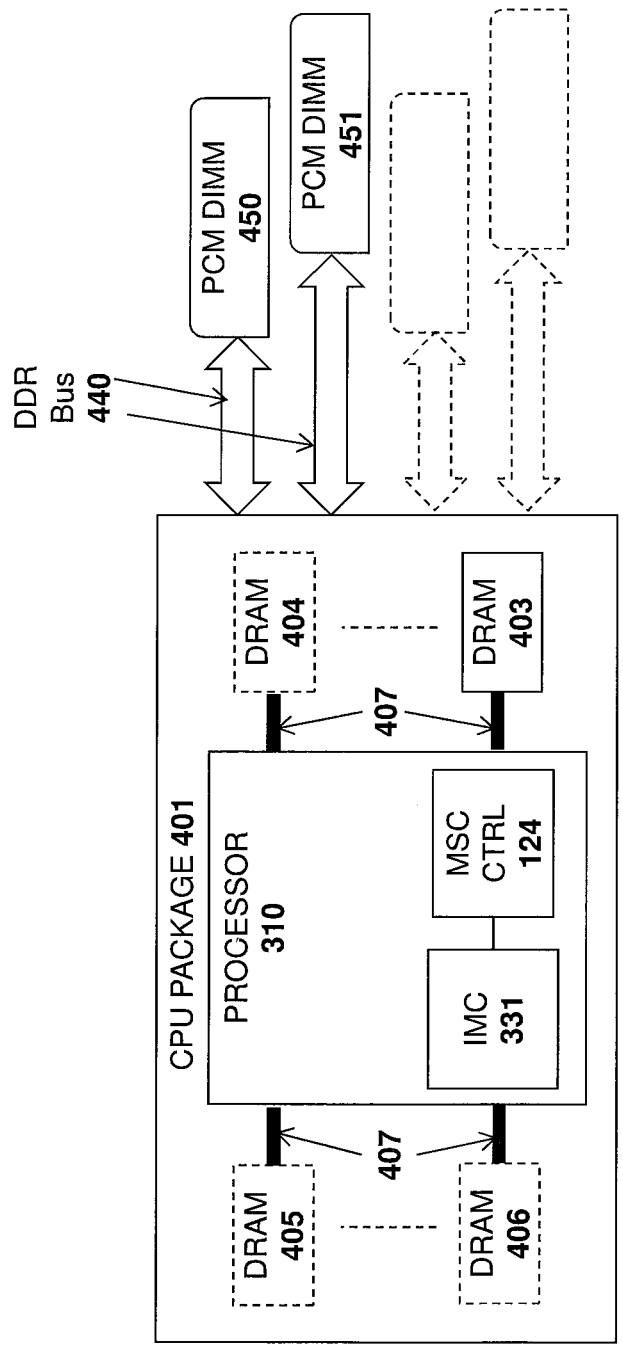
FIG. 4A illustrates a first system architecture which includes PCM according to embodiments of the invention.

While some of the same numerical designations are used across multiple figures in FIGS. 4A-N, this does not necessarily mean that that the structures identified by those numerical designations are always identical. For example, while the same numbers are used to identify an integrated memory controller (IMC) 331 and CPU 401 in several figures, these components may be implemented differently in different figures. Some of these differences are not highlighted because they are not pertinent to understanding the underlying principles of the invention.

While several different system platform configuration approaches are described below, these approaches fall into two broad categories: split architecture, and unified architecture. Briefly, in the split architecture scheme, a memory side cache (MSC) controller (e.g., located in the processor die or on a separate die in the CPU package) intercepts all system memory requests. There are two separate interfaces that "flow downstream" from that controller that exit the CPU package to couple to the Near Memory and Far Memory. Each interface is tailored for the specific type of memory and each memory can be scaled independently in terms of performance and capacity.

In the unified architecture scheme a single memory interface exits the processor die or CPU package and all memory requests are sent to this interface. The MSC controller along with the Near and Far Memory subsystems are consolidated on this single interface. This memory interface must be tailored to meet the memory performance requirements of the processor and must support a transactional, out-of-order protocol at least because PCMS devices may not process read requests in order. In accordance with the above general categories, the following specific platform configurations may be employed.

The embodiments described below include various types of buses/channels. The terms "bus" and "channel" are used synonymously herein. The number of memory channels per DIMM socket will depend on the particular CPU package used in the computer system (with some CPU packages supporting, for example, three memory channels per socket).

Additionally, in the embodiments described below which use DRAM, virtually any type of DRAM memory channels may be used including, by way of example and not limitation, DDR channels (e.g., DDR3, DDR4, DDR5, etc). Thus, while DDR is advantageous because of its wide acceptance in the industry, resulting price point, etc., the underlying principles of the invention are not limited to any particular type of DRAM or volatile memory.

FIG. 4A illustrates one embodiment of a split architecture which includes one or more DRAM devices 403-406 operating as near memory acting as cache for FM (i.e., MSC) in the CPU package 401 (either on the processor die or on a separate die) and one or more NVRAM devices such as PCM memory residing on DIMMs 450-451 acting as far memory. High bandwidth links 407 on the CPU package 401 interconnect a single or multiple DRAM devices 403-406 to the processor 310 which hosts the integrated memory controller (IMC) 331 and MSC controller 124. Although illustrated as separate units in FIG. 4A and other figures described below, the MSC controller 124 may be integrated within the memory controller 331 in one embodiment.

The DIMMs 450-451 use DDR slots and electrical connections defining a DDR channels 440 with DDR address, data and control lines and voltages (e.g., the DDR3 or DDR4 standard as defined by the Joint Electron Devices Engineering Council (JEDEC)). The PCM devices on the DIMMs 450-451 provide the far memory capacity of this split architecture, with the DDR channels 440 to the CPU package 401 able to carry both DDR and transactional protocols. In contrast to DDR protocols in which the processor 310 or other logic within the CPU package (e.g., the IMC 331 or MSC controller 124) transmits a command and receives an immediate response, the transactional protocol used to communicate with PCM devices allows the CPU 401 to issue a series of transactions, each identified by a unique transaction ID. The commands are serviced by a PCM controller on the recipient one of the PCM DIMMs, which sends responses back to the CPU package 401, potentially out of order. The processor 310 or other logic within the CPU package 401 identifies each transaction response by its transaction ID, which is sent with the response. The above configuration allows the system to support both standard DDR DRAM-based DIMMs (using DDR protocols over DDR electrical connections) and PCM-based DIMMs configurations (using transactional protocols over the same DDR electrical connections).

Figure 4B:
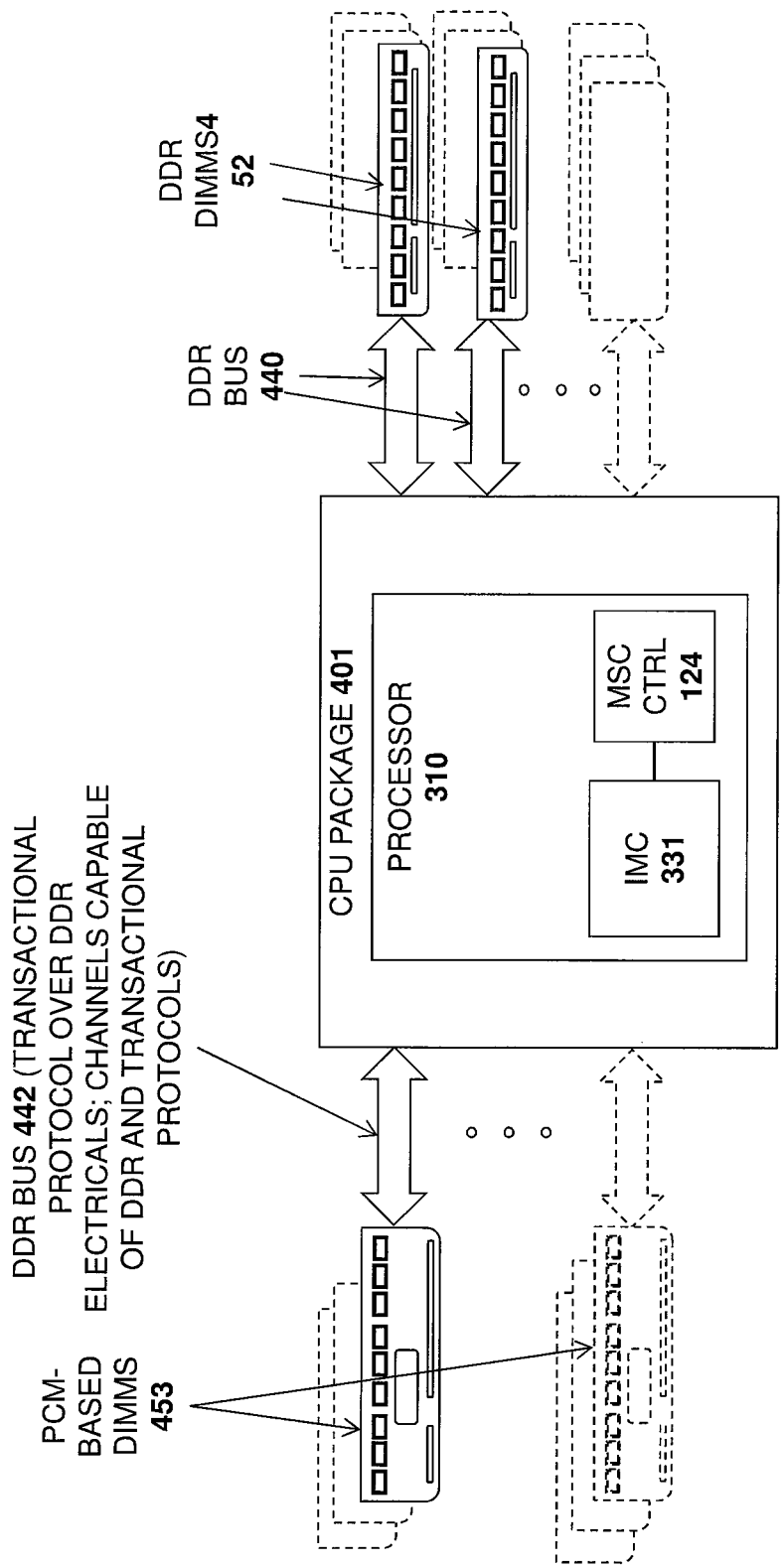
FIG. 4B illustrates a second system architecture which includes PCM according to embodiments of the invention.

FIG. 4B illustrates a split architecture which uses DDR DRAM-based DIMMs 452 coupled over DDR channels 440 to form near memory which acts as an MSC. The processor 310 hosts the memory controller 331 and MSC controller 124. NVRAM devices such as PCM memory devices reside on PCM-based DIMMs 453 that use DDR slots and electrical connections on additional DDR channels 442 off the CPU package 401. The PCM-based DIMMs 453 provide the far memory capacity of this split architecture, with the DDR channels 442 to the CPU package 401 being based on DDR electrical connections and able to carry both DDR and transactional protocols. This allows the system to be configured with varying numbers of DDR DRAM DIMMs 452 (e.g., DDR4 DIMMS) and PCM DIMMs 453 to achieve the desired capacity and/or performance points.

Figure 4C:
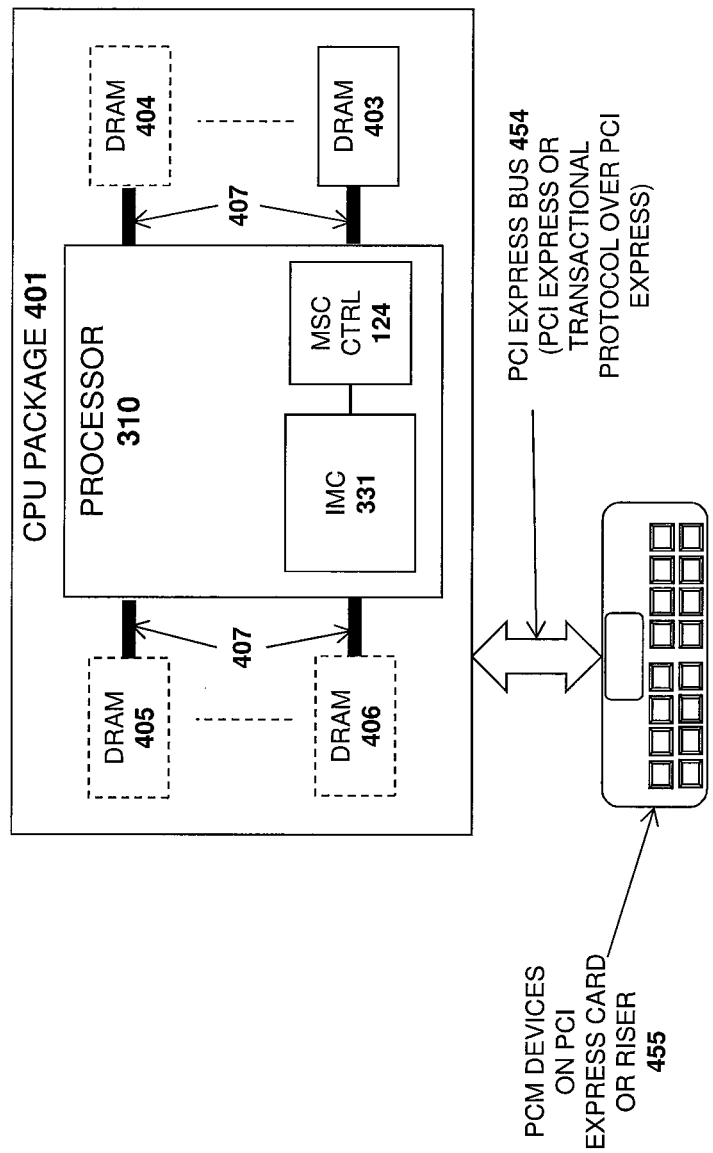
FIG. 4C illustrates a third system architecture which includes PCM according to embodiments of the invention.

FIG. 4C illustrates a split architecture which hosts the near memory 403-406 acting as a memory side cache (MSC) on the CPU package 401 (either on the processor die or on a separate die). High bandwidth links 407 on the CPU package are used to interconnect a single or multiple DRAM devices 403-406 to the processor 310 which hosts the memory controller 331 and the MSC controller 124, as defined by the split architecture. NVRAM such as PCM memory devices reside on PCI Express cards or risers 455 that use PCI Express electrical connections and PCI Express protocol or a different transactional protocol over the PCI Express bus 454. The PCM devices on the PCI Express cards or risers 455 provide the far memory capacity of this split architecture.

Figure 4D:
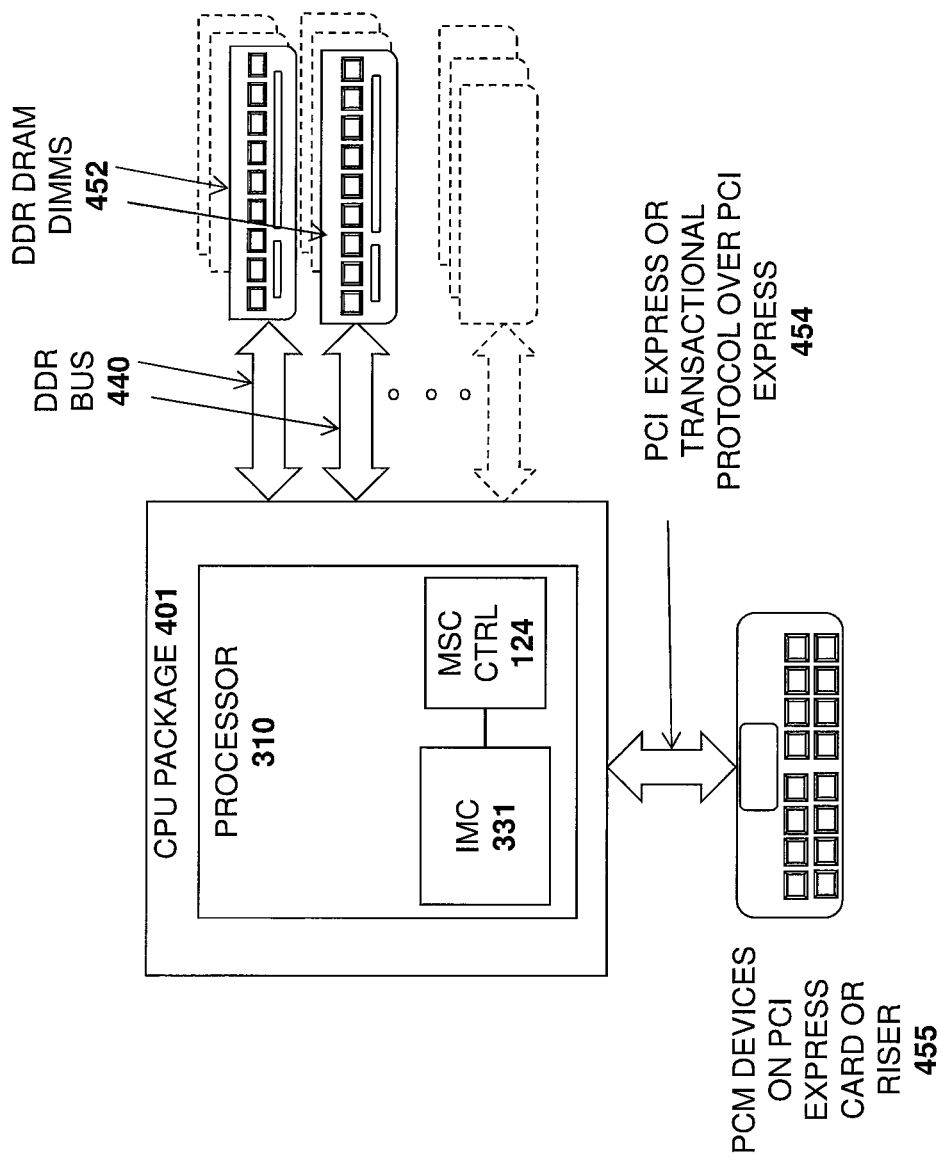
FIG. 4D illustrates a fourth system architecture which includes PCM according to embodiments of the invention.

FIG. 4D is a split architecture which uses DDR DRAM-based DIMMs 452 and DDR channels 440 to form the near memory which acts as an MSC. The processor 310 hosts the memory controller 331 and MSC controller 124. NVRAM such as PCM memory devices 455 reside on PCI Express cards or risers that use PCI Express electrical connections and PCI Express protocol or a different transactional protocol over the PCI Express link 454. The PCM devices on the PCI Express cards or risers 455 provide the far memory capacity of this split architecture, with the memory channel interfaces off the CPU package 401 providing multiple DDR channels 440 for DDR DRAM DIMMs 452.

Figure 4E:
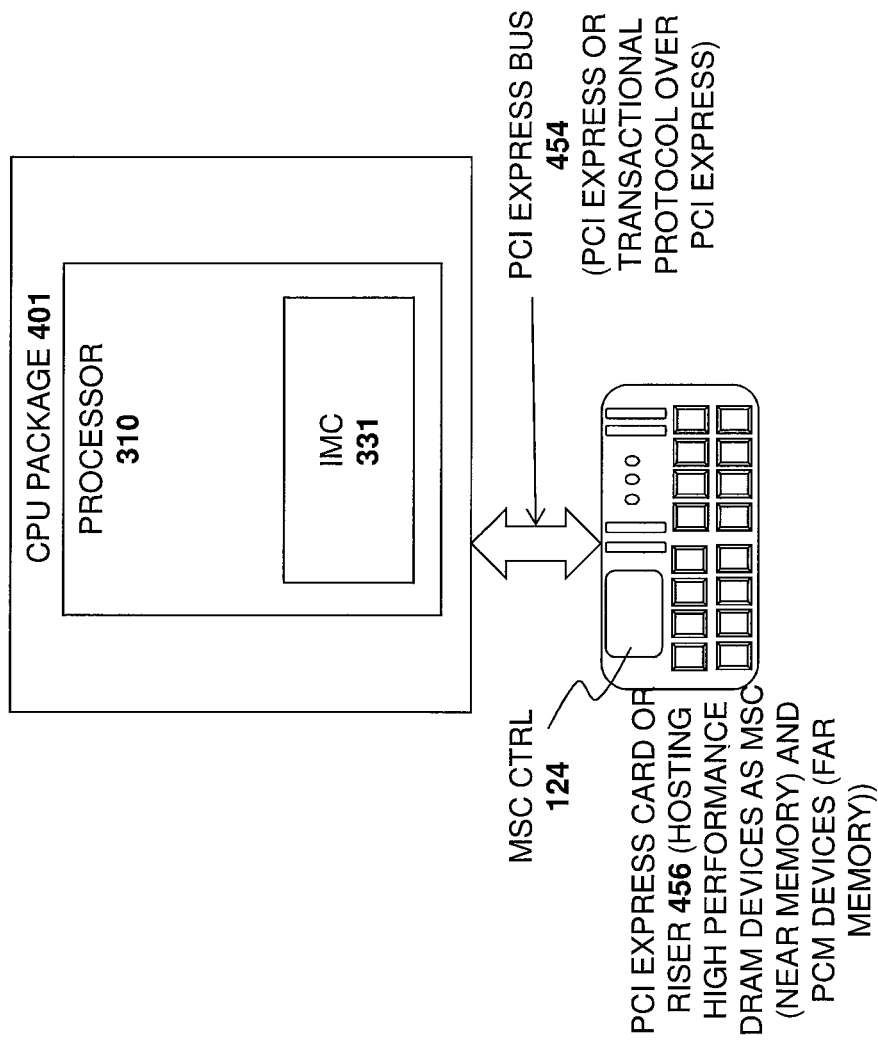
FIG. 4E illustrate a fifth system architecture which includes PCM according to embodiments of the invention.

FIG. 4E illustrates a unified architecture which hosts both near memory acting as an MSC and far memory NVRAM such as PCM on PCI Express cards or risers 456 that use PCI Express electrical connections and PCI Express protocol or a different transactional protocol over the PCI Express bus 454. The processor 310 hosts the integrated memory controller 331 but, in this unified architecture case, the MSC controller 124 resides on the card or riser 456, along with the DRAM near memory and NVRAM far memory.

Figure 4F:
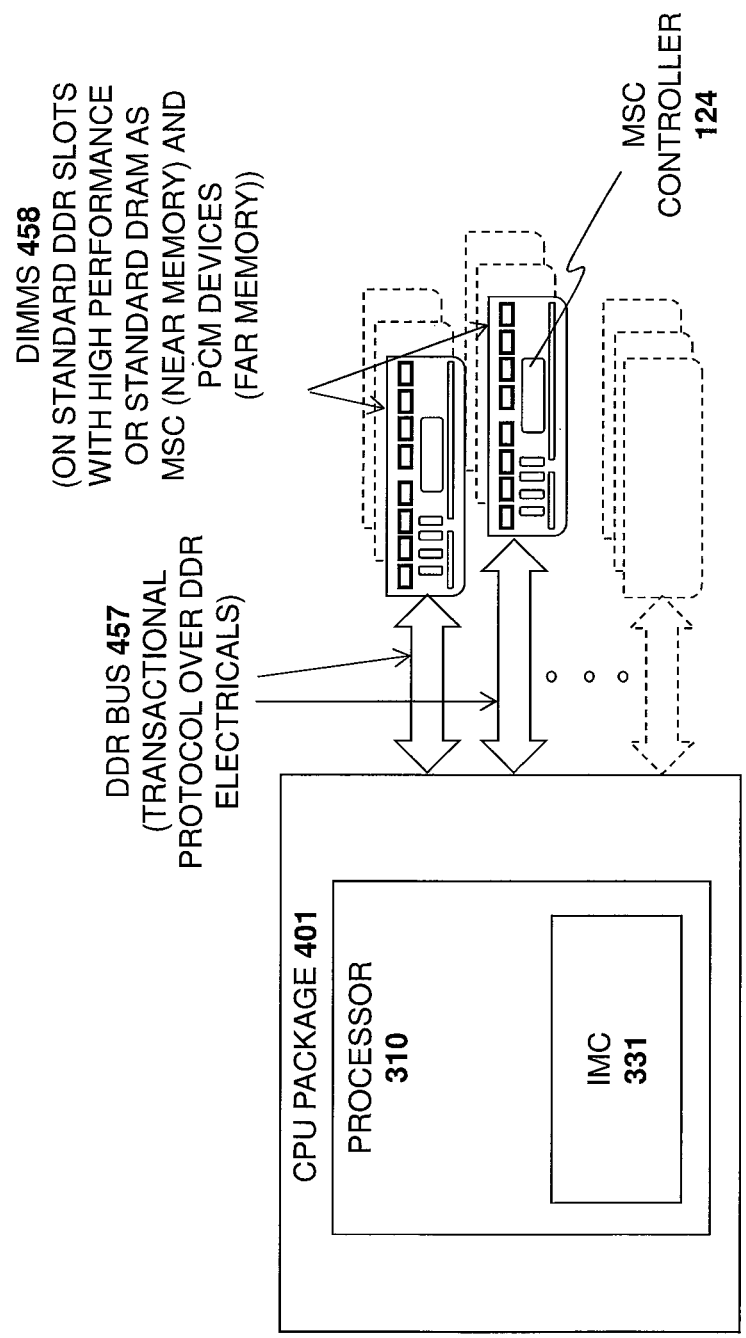
FIG. 4F illustrate a sixth system architecture which includes PCM according to embodiments of the invention.

FIG. 4F illustrates a unified architecture which hosts both the near memory acting as an MSC and the far memory NVRAM such as PCM, on DIMMs 458 using DDR channels 457. The near memory in this unified architecture comprises DRAM on each DIMM 458, acting as the memory side cache to the PCM devices on that same DIMM 458, that form the far memory of that particular DIMM. The MSC controller 124 resides on each DIMM 458, along with the near and far memory. In this embodiment, multiple memory channels of a DDR bus 457 are provided off the CPU package. The DDR bus 457 of this embodiment implements a transactional protocol over DDR electrical connections.

Figure 4G:
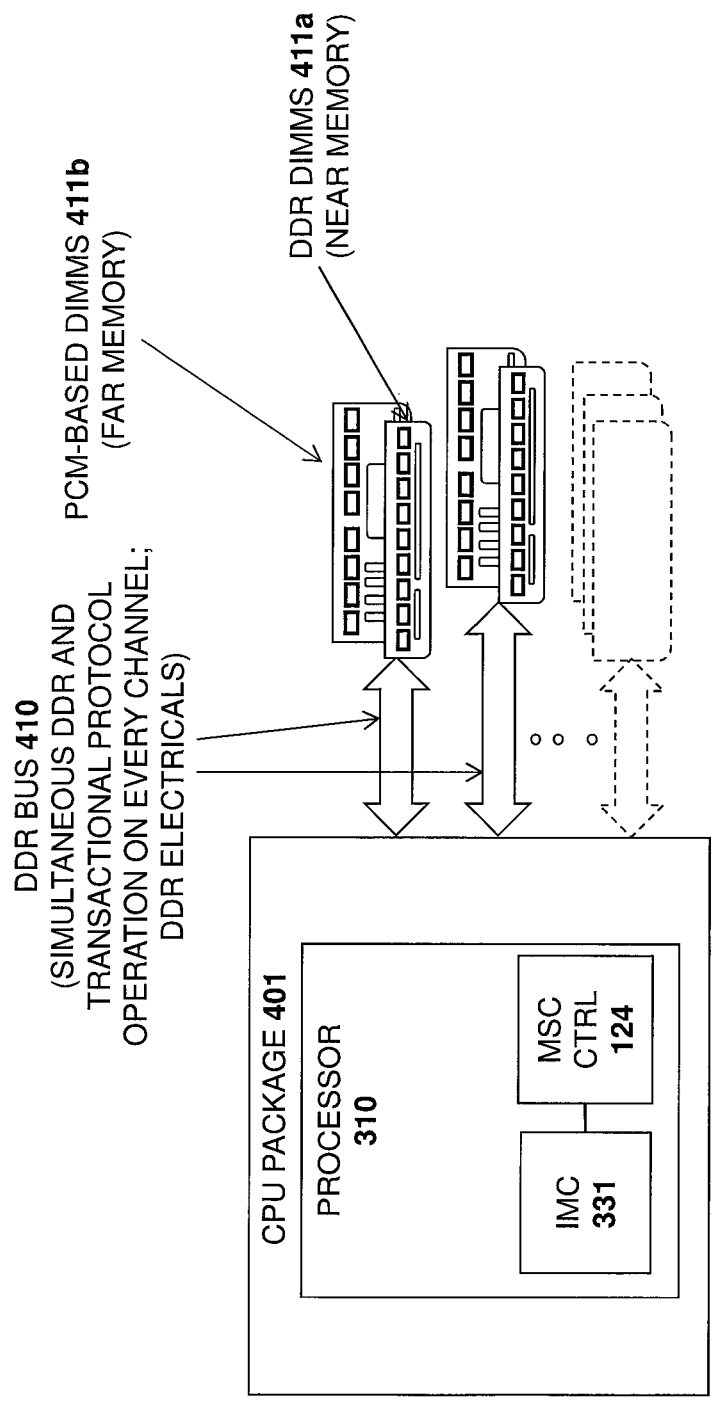
FIG. 4G illustrates a seventh system architecture which includes PCM according to embodiments of the invention.

FIG. 4G illustrates a hybrid split architecture, whereby the MSC controller 124 resides on the processor 310 and both near memory and far memory interfaces share the same DDR bus 410. This configuration uses DRAM-based DDR DIMMs 411a as near memory acting as an MSC with the PCM-Based DIMMs 411b (i.e., far memory) residing on the same memory channel of the DDR bus 410, using DDR slots and NVRAM (such as PCM memory devices). The memory channels of this embodiment carry both DDR and transactional protocols simultaneously to address the near memory and far memory DIMMs, 411a and 411b, respectively.

Figure 4H:
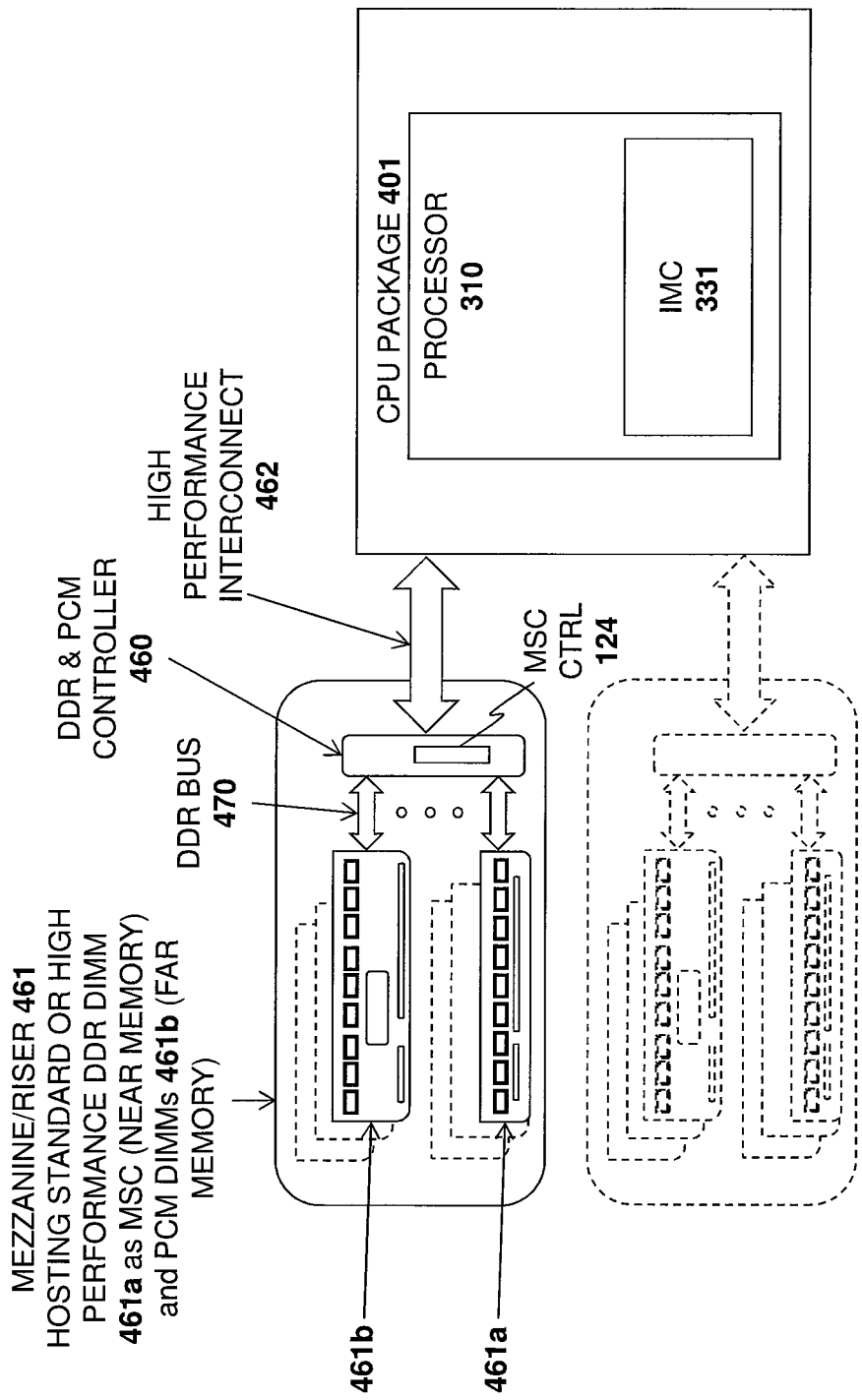
FIG. 4H illustrates an eight system architecture which includes PCM according to embodiments of the invention.

FIG. 4H illustrates a unified architecture in which the near memory 461a acting as a memory side cache resides on a mezzanine or riser 461, in the form of DRAM-based DDR DIMMs. The memory side cache (MSC) controller 124 is located in the riser's DDR and PCM controller 460 which may have two or more memory channels connecting to DDR DIMM channels 470 on the mezzanine/riser 461 and interconnecting to the CPU over high performance interconnect(s) 462 such as a differential memory link. The associated far memory 461b sits on the same mezzanine/riser 461 and is formed by DIMMs that use DDR channels 470 and are populated with NVRAM (such as PCM devices).

Figure 4I:
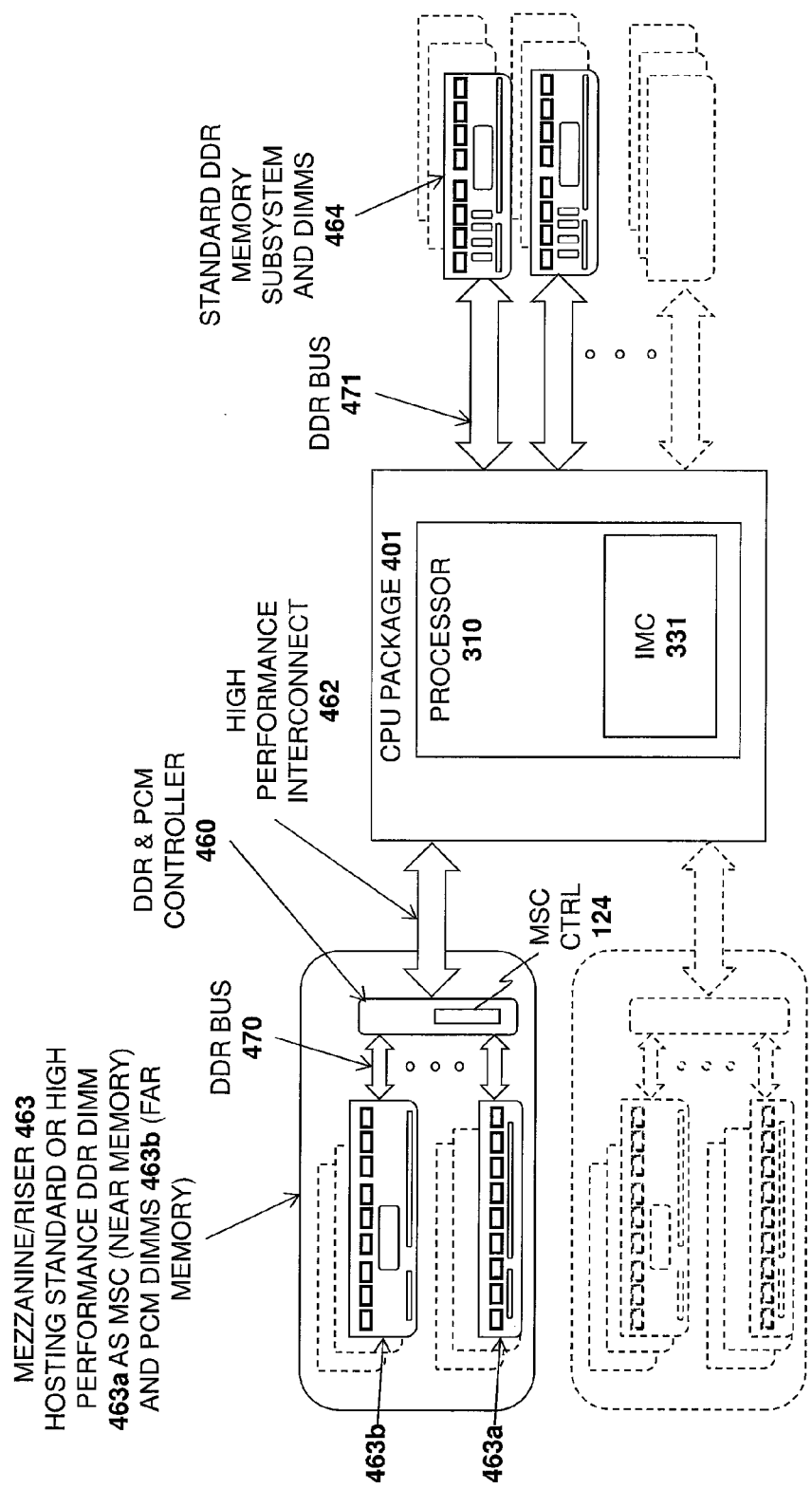
FIG. 4I illustrates a ninth system architecture which includes PCM according to embodiments of the invention.

FIG. 4I illustrates a unified architecture that can be used as memory capacity expansion to a DDR memory subsystem and DIMMs 464 connected to the CPU package 401 on its DDR memory subsystem, over a DDR bus 471. For the additional NVM-based capacity in this configuration, the near memory acting as a MSC resides on a mezzanine or riser 463, in the form of DRAM based DDR DIMMs 463a. The MSC controller 124 is located in the riser's DDR and PCM controller 460 which may have two or more memory channels connecting to DDR DIMM channels 470 on the mezzanine/ riser and interconnecting to the CPU over high performance interconnect(s) 462 such as a differential memory link. The associated far memory 463b sits on the same mezzanine/riser 463 and is formed by DIMMs 463b that use DDR channels 470 and are populated with NVRAM (such as PCM devices).

Figure 4J:
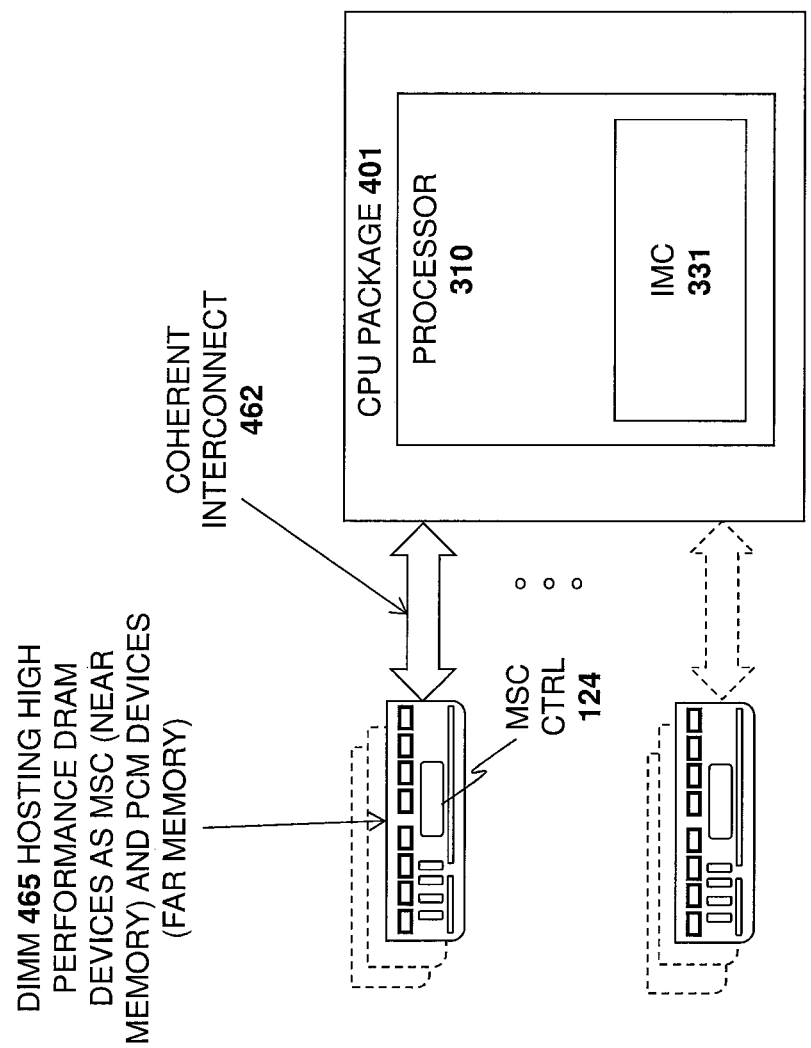
FIG. 4J illustrates a tenth system architecture which includes PCM according to embodiments of the invention.

FIG. 4J is a unified architecture in which a near memory acting as a memory side cache (MSC) resides on each and every DIMM 465, in the form of DRAM. The DIMMs 465 are on a high performance interconnect/channel(s) 462, such as a differential memory link, coupling the CPU package 401 with the MSC controller 124 located on the DIMMs. The associated far memory sits on the same DIMMs 465 and is formed by NVRAM (such as PCM devices).

Figure 4K:
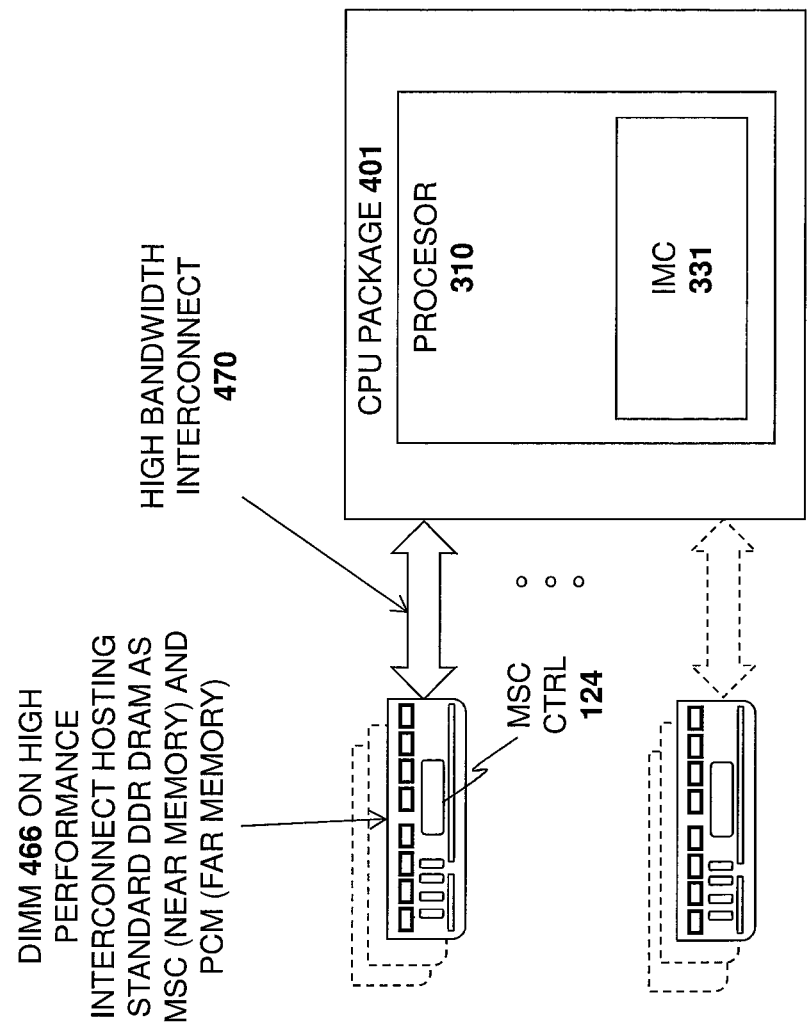
FIG. 4K illustrates an eleventh system architecture which includes PCM according to embodiments of the invention.

FIG. 4K illustrates a unified architecture in which the near memory acting as a MSC resides on every DIMM 466, in the form of DRAM. The DIMMs are on high performance interconnect(s) 470 connecting to the CPU package 401 with the MSC controller 124 located on the DIMMs. The associated far memory sits on the same DIMM 466 and is formed by NVRAM (such as PCM devices).

Figure 4L:
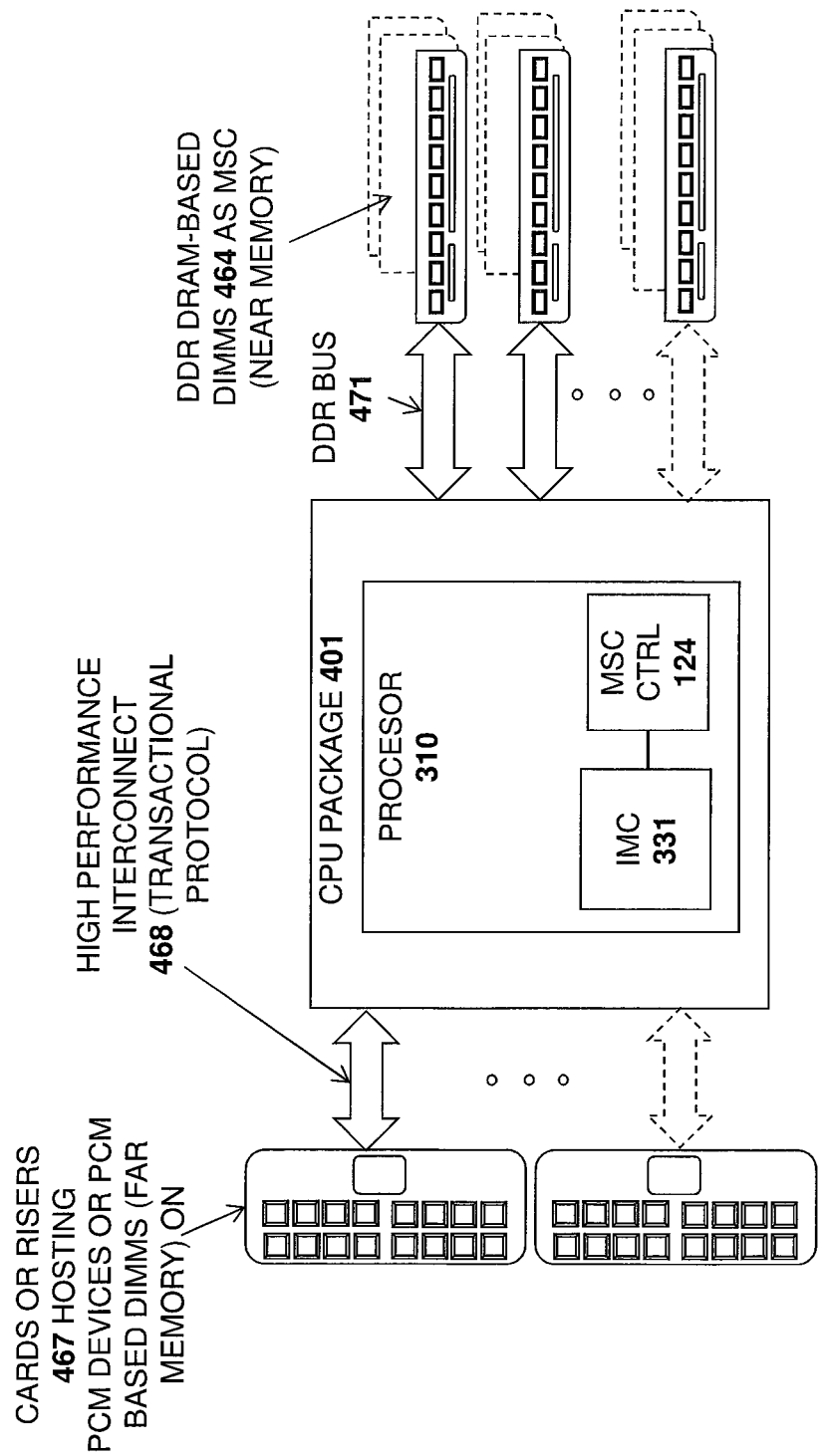
FIG. 4L illustrates a twelfth system architecture which includes PCM according to embodiments of the invention.

FIG. 4L illustrates a split architecture which uses DDR DRAM-based DIMMs 464 on a DDR bus 471 to form the necessary near memory which acts as a MSC. The processor 310 hosts the integrated memory controller 331 and memory side cache controller 124. NVRAM such as PCM memory forms the far memory which resides on cards or risers 467 that use high performance interconnects 468 communicating to the CPU package 401 using a transactional protocol. The cards or risers 467 hosting the far memory host a single buffer/controller that can control multiple PCM-based memories or multiple PCM-based DIMMs connected on that riser.

Figure 4M:
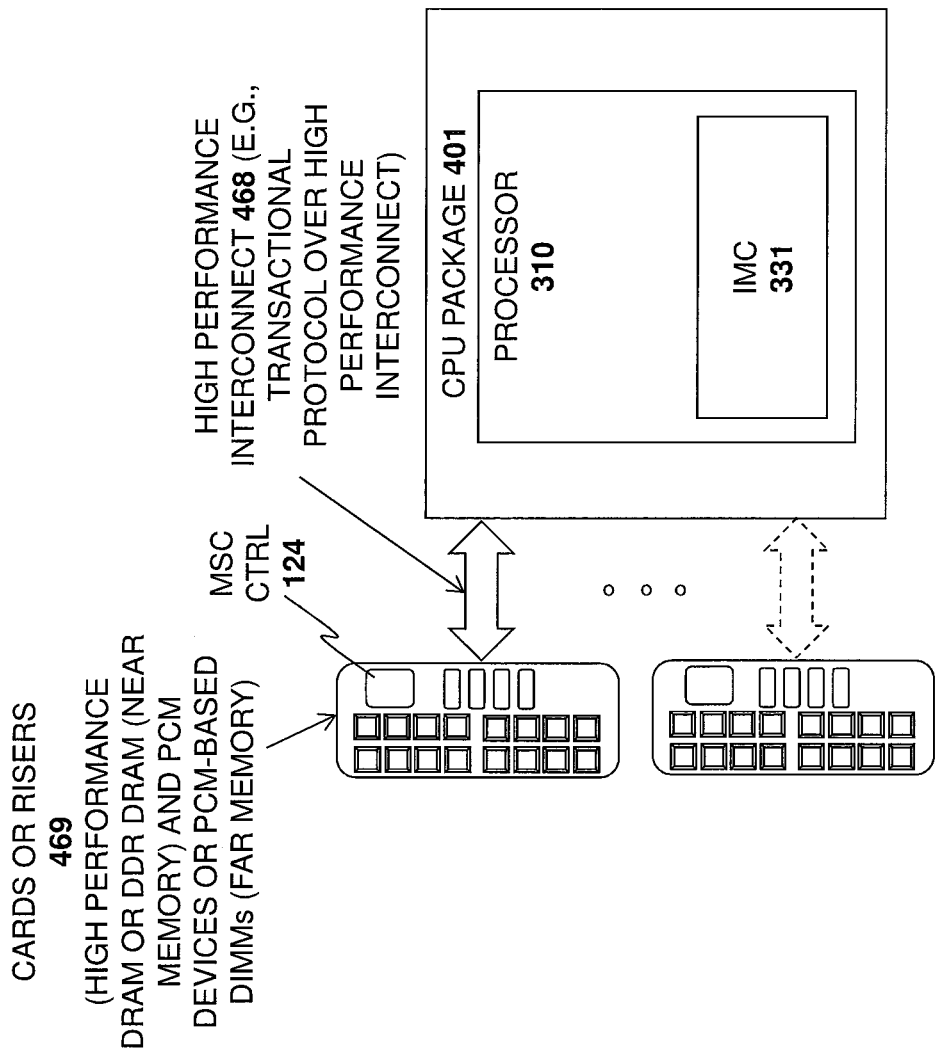
FIG. 4M illustrates a thirteenth system architecture which includes PCM according to embodiments of the invention.

FIG. 4M illustrates a unified architecture which may use DRAM on a card or riser 469 to form the necessary near memory which acts as a MSC. NVRAM such as PCM memory devices form the far memory which also resides on the cards or risers 469 that use high performance interconnects 468 to the CPU package 401. The cards or risers 469 hosting the far memory hosts a single buffer/controller that can control multiple PCM-based devices or multiple PCM based DIMMs on that riser 469 and also integrates the memory side cache controller 124.

In some of the embodiments described above, such as that illustrated in FIG. 4G, the DRAM DIMMS 411a and PCM-based DIMMS 411b reside on the same memory channel. Consequently the same set of address/control and data lines are used to connect the CPU to both the DRAM and PCM memories. In order to reduce the amount of data traffic through the CPU mesh interconnect, in one embodiment, a DDR DIMM on a common memory channel with a PCM-based DIMM is configured to act as the sole MSC for data stored in the PCM-based DIMM. In such a configuration, the far memory data stored in the PCM-based DIMM is only cached in the DDR DIMM near memory within the same memory channel, thereby localizing memory transactions to that particular memory channel.

Additionally, to implement the above embodiment, the system address space may be logically subdivided between the different memory channels. For example, if there are four memory channels, then ¼ of the system address space may be allocated to each memory channel. If each memory channel is provided with one PCMS-based DIMM and one DDR DIMM, the DDR DIMM may be configured to act as the MSC for that ¼ portion of the system address space.

The choice of system memory and mass storage devices may depend on the type of electronic platforms on which embodiments of the invention are employed. For example, in a personal computer, tablet computer, notebook computer, smartphone, mobile phone, feature phone, personal digital assistant (PDA), portable media player, portable gaming device, gaming console, digital camera, switch, hub, router, set-top box, digital video recorder, or other devices that have relatively small mass storage requirements, the mass storage may be implemented using NVRAM mass storage 152A alone, or using NVRAM mass storage 152A in combination with a flash/magnetic/optical mass storage 152B. In other electronic platforms that have relatively large mass storage requirements (e.g., large-scale servers), the mass storage may be implemented using magnetic storage (e.g., hard drives) or any combination of magnetic storage, optical storage, holographic storage, mass-storage flash memory, and NVRAM mass storage 152A. In such a case, system hardware and/or software responsible for storage may implement various intelligent persistent storage allocation techniques to allocate blocks of persistent program code and data between the FM 151B/NVRAM storage 152A and a flash/magnetic/optical mass storage 152B in an efficient or otherwise useful manner.

For example, in one embodiment a high powered server is configured with a near memory (e.g., DRAM), a PCMS device, and a magnetic mass storage device for large amounts of persistent storage. In one embodiment, a notebook computer is configured with a near memory and a PCMS device which performs the role of both a far memory and a mass storage device (i.e., which is logically partitioned to perform these roles as shown in FIG. 3). One embodiment of a home or office desktop computer is configured similarly to a notebook computer, but may also include one or more magnetic storage devices to provide large amounts of persistent storage capabilities.

One embodiment of a tablet computer or cellular telephony device is configured with PCMS memory but potentially no near memory and no additional mass storage (for cost/power savings). However, the tablet/telephone may be configured with a removable mass storage device such as a flash or PCMS memory stick.

Various other types of devices may be configured as described above. For example, portable media players and/or personal digital assistants (PDAs) may be configured in a manner similar to tablets/telephones described above, gaming consoles may be configured in a similar manner to desktops or laptops. Other devices which may be similarly configured include digital cameras, routers, set-top boxes, digital video recorders, televisions, and automobiles.

Embodiments of a MSC Architecture

In one embodiment of the invention, the bulk of DRAM in system memory is replaced with PCM. As previously discussed, PCM provides significant improvements in memory capacity at a significantly lower cost relative to DRAM and is non-volatile. However, certain PCM characteristics such as asymmetrical Read-vs-Write performance, write cycling endurance limits, as well as its non-volatile nature makes it challenging to directly replace DRAM without incurring major software changes. The embodiments of the invention described below provide a software-transparent way to integrate PCM while also enabling newer usages through software enhancements. These embodiments promote a successful transition in memory subsystem architecture and provide a way to consolidate both memory and storage using a single PCM pool, thus mitigating the need for a separate non-volatile storage tier in the platform.

Figure 5A:
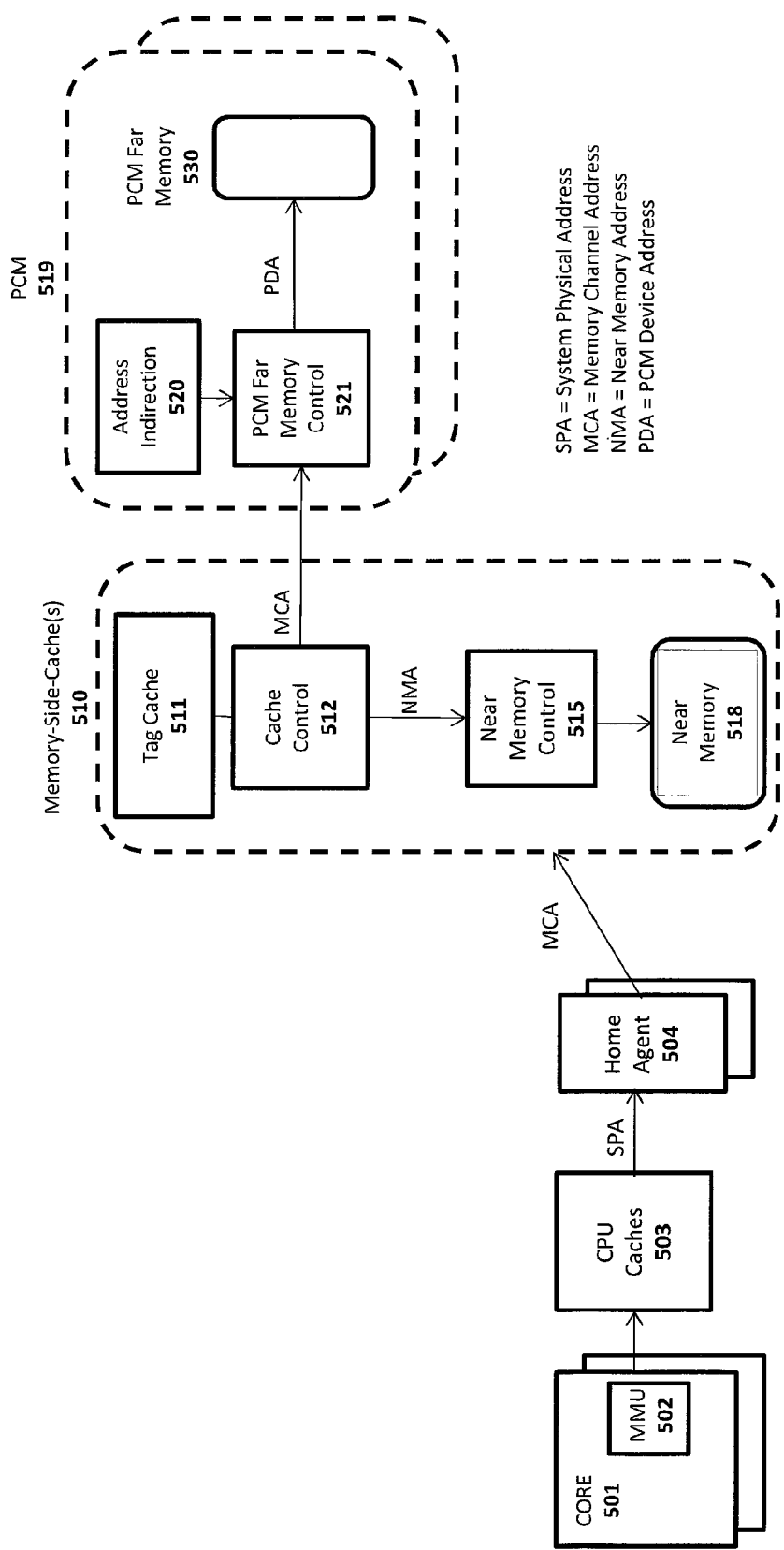
FIG. 5A illustrates one embodiment of a system architecture which includes a volatile near memory and a non-volatile far memory.

The particular embodiment illustrated in FIG. 5A includes one or more processor cores 501 each with an internal memory management unit (MMU) 502 for generating memory requests and one or more internal CPU caches 503 for storing lines of program code and data according to a specified cache management policy. As previously mentioned, the cache management policy may comprise an exclusive cache management policy (in which any line present in one particular cache level in the hierarchy is not present in any other cache level) or an inclusive cache management policy (in which duplicate cache lines are stored at different levels of the cache hierarchy). The specific cache management policies which may be employed for managing the internal caches 503 are well understood by those of skill in the art and, as such, will not be described here in detail. The underlying principles of the invention are not limited to any particular cache management policy.

Also illustrated in FIG. 5A is a home agent 505 which provides access to the MSC 510 by generating memory channel addresses (MCAs) for memory requests. The home agent 505 is responsible for managing a specified memory address space and resolves memory access conflicts directed to that memory space. Thus, if any core needs to access a given address space, it will send requests to that home agent 505, which will then send the request to that particular MMU 502. In one embodiment, one home agent 505 is allocated per MMU 502; however, in some embodiments, a single home agent 505 may service more than one memory management unit 502.

As illustrated in FIG. 5A, a MSC 510 is configured in front of the PCM-based far memory 519. The MSC 510 manages access to a near memory 518 and forwards memory access requests (e.g., reads and writes) to the far memory controller 521 when appropriate (e.g., when the requests cannot be serviced from the near memory 518). The MSC 510 includes a cache control unit 512 which operates responsive to a tag cache 511 which stores tags which identify the cache lines contained within the near memory 518. In operation, when the cache control unit 512 determines that the memory access request can be serviced from the near memory 518 (e.g., in response to a cache hit), it generates a near memory address (NMA) to identify data stored within the near memory 518. A near memory control unit 515 interprets the NMA and responsively generates electrical signals to access the near memory 518. As previously mentioned, in one embodiment, the near memory is a dynamic random access memory (DRAM). In such a case, the electrical signals may include row address strobe (RAS) and column address strobe (CAS) signals. It should be noted, however, that the underlying principles of the invention are not limited to the use of DRAM for near memory.

Another component that ensures software-transparent memory application is an optimized PCM far memory controller 521 that manages the PCM far memory 530 characteristics while still providing the performance required. In one embodiment, the PCM controller 521 includes an Address Indirection Table 520 that translates the MCA generated by the cache control unit 515 to a PDA which is used to directly address the PCM far memory 530. These translations may occur at the granularity of a "block" which is typically 5 KB. The translation is required as, in one embodiment, the far memory controller 521 continuously moves the PCM blocks throughout the PCM device address space to ensure no wear-out hot spots due to a high frequency of writes to any specific block. As previously described, such a technique is sometimes referred to herein as "wear-leveling".

Thus, the MSC 510 is managed by the cache control unit 512 which allows the MSC 510 to absorb, coalesce and filter transactions (e.g., reads and writes) to the PCM far memory 530. The cache control unit 512 manages all data movement and consistency requirements between the near memory 518 and the PCM far memory 530. Additionally, in one embodiment, the MSC cache controller 512 interfaces to the CPU(s) and provides the standard synchronous load/store interface used in traditional DRAM based memory subsystems.

Exemplary read and write operations will now be described within the context of the architecture shown in FIG. 5A. In one embodiment, a read operation will first arrive at the MSC controller 512 which will perform a look-up to determine if the requested data is present (e.g., utilizing the tag cache 511). If present, it will return the data to the requesting CPU, core 501 or I/O device (not shown). If the data is not present, the MSC controller 512 will send the request along with the system memory address (also referred to herein as the memory channel address or MCA) to the PCM far memory controller 521. The PCM controller 521 will use the Address Indirection Table 520 to translate the address to a PDA and direct the read operation to this region of the PCM. Upon receiving the requested data from the PCM far memory 530, the PCM controller 521 will return the requested data to the MSC controller 512 which will store the data in the MSC near memory 518 and also send the data to the requesting CPU core 501, or I/O Device. Subsequent requests for this data may be serviced directly from the MSC near memory 518 until it is replaced by some other PCM data.

In one embodiment, a memory write operation also first goes to the MSC controller 512 which writes it into the MSC near memory 518. In this embodiment, the data may not be sent directly to the PCM far memory 530 when a write operation is received. For example, the data may be sent to the PCM far memory 530 only when the location in the MSC near memory 518 in which the data is stored must be re-used for storing data for a different system memory address. When this happens, the MSC controller 512 notices that the data is not current in PCM far memory 530 and will thus retrieve it from near memory 518 and send it to the PCM controller 521. The PCM controller 521 looks up the PDA for the system memory address and then writes the data to the PCM far memory 530.

In one embodiment, the size of the MSC near memory 518 will be dictated by the workload memory requirements as well as the near and far memory performance. For a DRAM-based MSC, the size may be set to a tenth the size of the workload memory footprint or the PCM far memory 530 size. Such an MSC is very large compared to conventional caches found in current processor/system architectures. By way of example, and not limitation, for a PCM far memory size of 128 GB, the size of the MSC near memory can be as large as 16 GB.

Figure 5B:
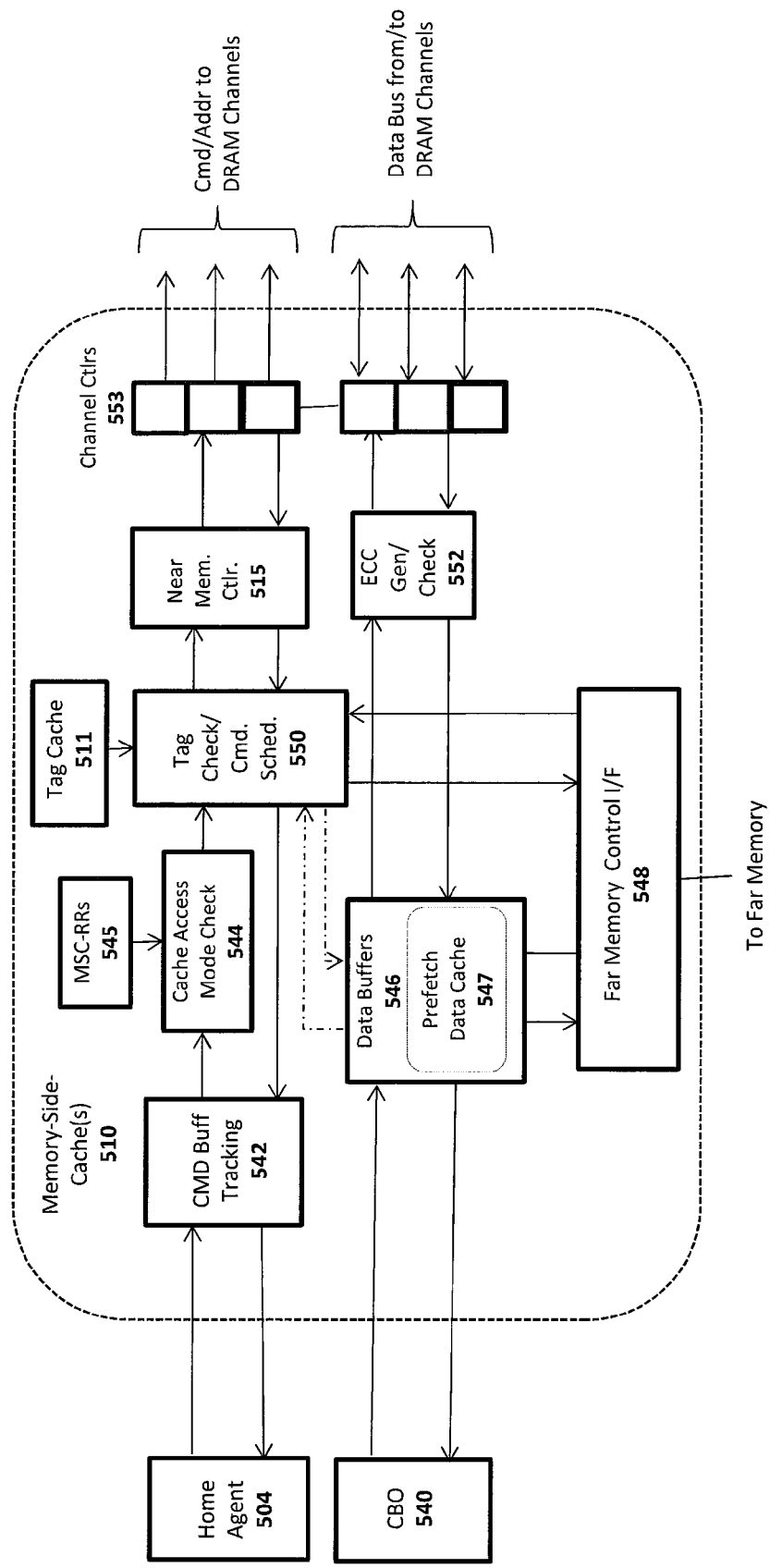
FIG. 5B illustrates one embodiment of a memory side cache (MSC)

FIG. 5B illustrates additional details associated with one embodiment of the MSC 510. This embodiment includes a set of logical units responsible for commands and addressing including a command buffer tracking unit 542 for buffering commands/addresses and a cache access mode check unit 544 which selects an MSC operating mode in response to control signal from an MSC Range Register (RR) unit 545. Several exemplary modes of operation are described below. Briefly, these may include modes in which the near memory is used in a traditional caching role and modes in which the near memory 518 forms part of system memory. A tag checking/command scheduler 550 uses tags from the tag cache 511 to determine whether a particular cache line is stored in the near memory 518 and a near memory controller 515 generates channel address signals (e.g., CAS and RAS signals).

This embodiment also includes a set of logical units responsible for data routing and processing including a set of data buffers 546 for storing data fetched from near memory or stored to near memory. In one embodiment, a prefetch data cache 547 is also included for storing data prefetched from near memory and/or far memory. However, the prefetch data cache 547 is optional and is not necessary for complying with the underlying principles of the invention.

An error correction code (ECC) generator/checker unit 552 generates and checks ECCs to ensure that data written to or read from near memory is free from errors. As discussed below, in one embodiment of the invention, the ECC generator/checker unit 552 is modified to store cache tags. Specific ECCs are well understood by those of ordinary skill in the art and will therefore not be described here in detail. The channel controllers 553 couple the data bus of the near memory 518 to the MSC 510 and generate the necessary electrical signaling for accessing the near memory 518 (e.g., RAS and CAS signaling for a DRAM near memory).

Also illustrated in FIG. 5B is a far memory control interface 548 for coupling the MSC 510 to far memory. In particular, the far memory control interface 548 generates the MCAs required to address the far memory and communicates data between the data buffers 546 and far memory.

As mentioned, the near memory 518 employed in one embodiment is very large compared to conventional caches found in current processor/system architectures. Consequently, the tag cache 511 that maintains the system memory address translation to near memory addresses may also be very large. The cost of storing and looking up the MSC tags can be a significant impediment to building large caches. As such, in one embodiment of the invention, this issue is resolved using an innovative scheme that stores the cache tags within the storage allocated in the MSC for ECC protection, thereby essentially removing the cost of storage for the tags.

Figure 5C:
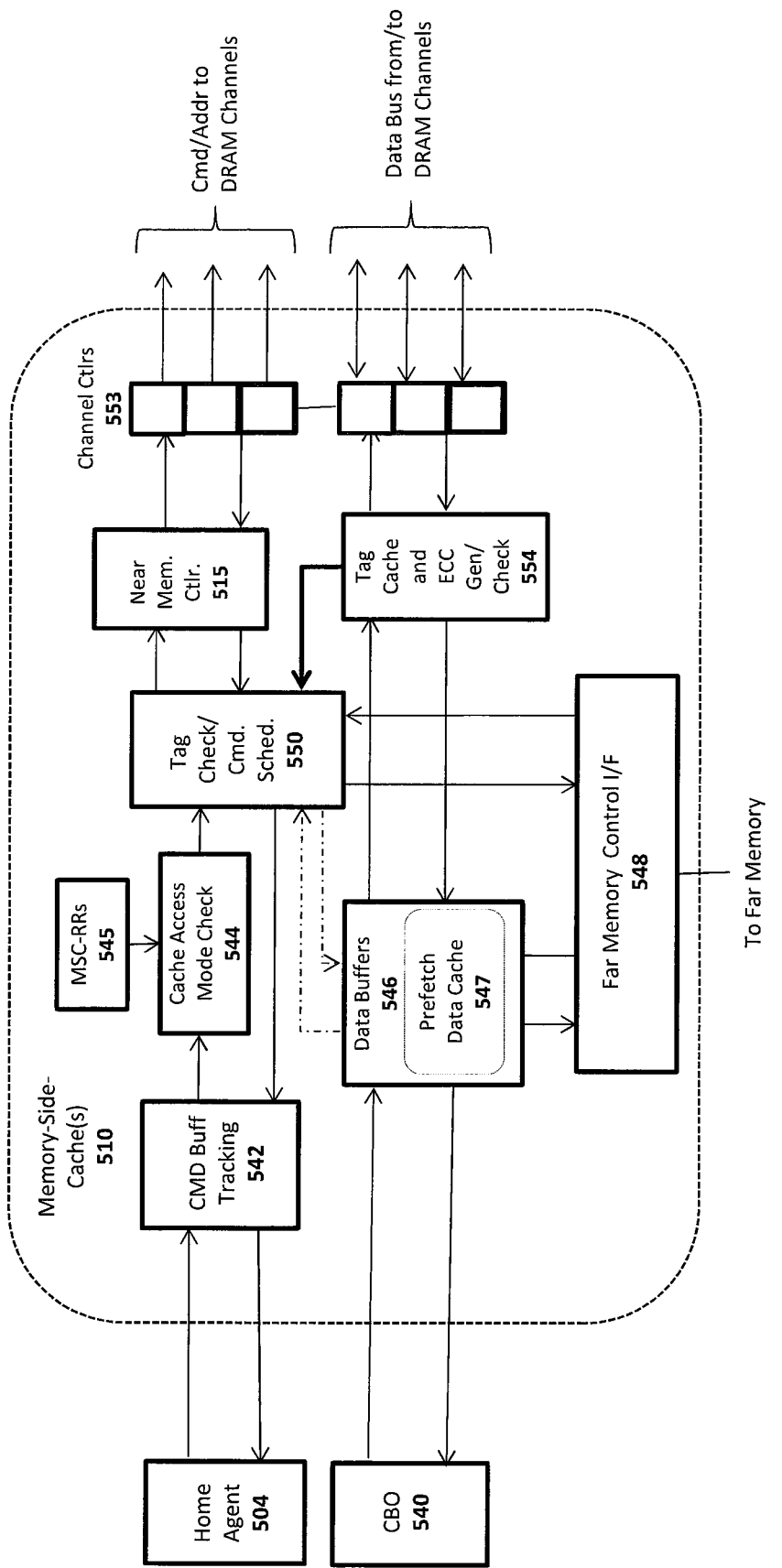
FIG. 5C illustrates another embodiment of a memory side cache (MSC) which includes an integrated tag cache and ECC generation/check logic.

This embodiment is illustrated generally in FIG. 5C which shows an integrated tag cache and ECC unit 554 for storing/managing cache tags, storing ECC data, and performing ECC operations. As illustrated, the stored tags are provided to the tag check/command scheduler 550 upon request when performing tag check operations (e.g., to determine if a particular block of data is stored within the near memory cache 518).

Figure 5D:
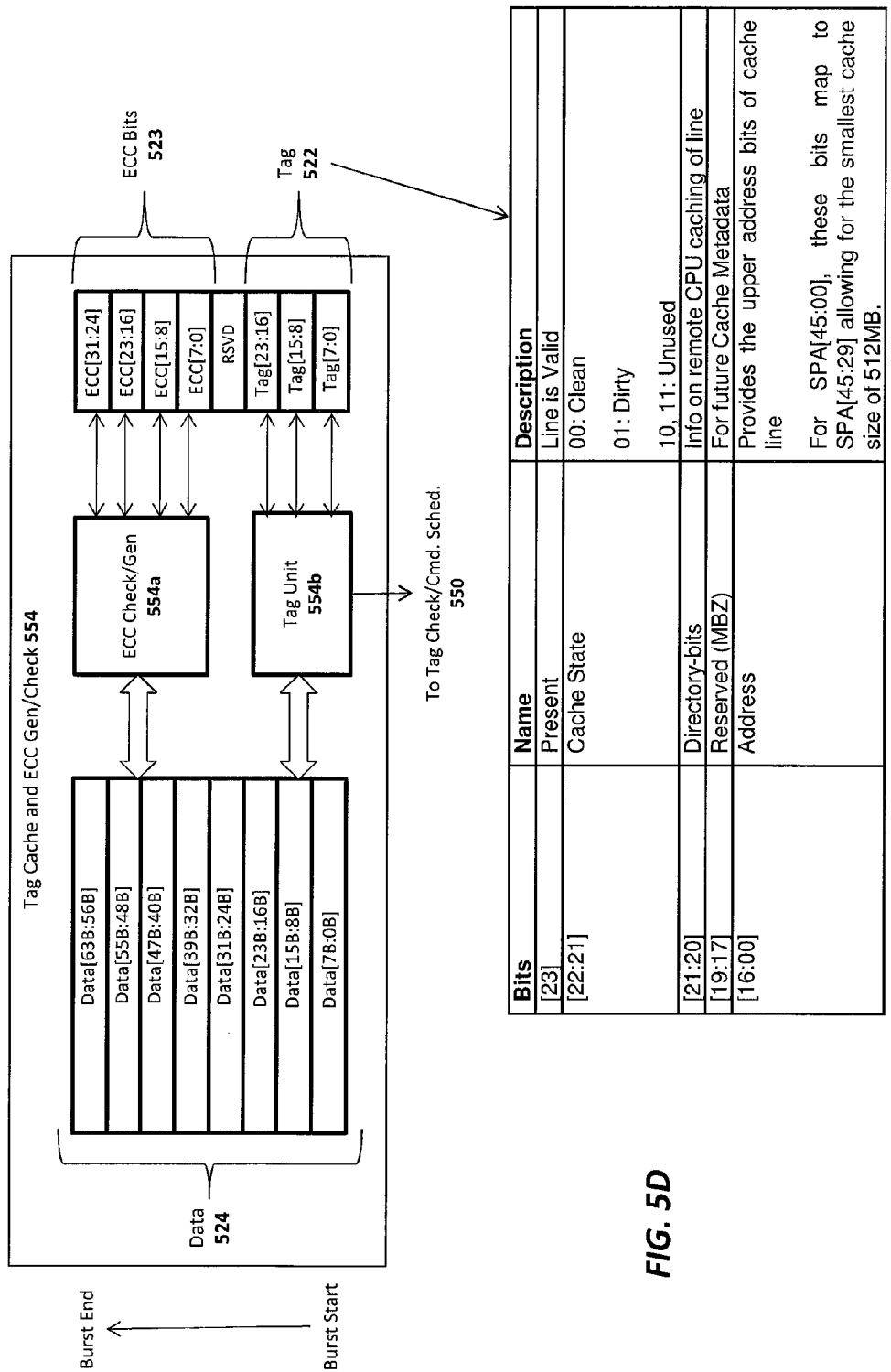
FIG. 5D illustrates one embodiment of an exemplary tag cache and ECC generator/check unit.

FIG. 5D illustrates the organization of an exemplary set of data 524 and a corresponding ECC 523 and tag 522. As illustrated, the tag 522 is co-located with the ECC 523 in a memory of the tag cache/ECC unit 554 (e.g., DDR DRAM in one embodiment). In this example, several blocks of data totaling 64 Bytes has been read into the tag cache/ECC unit 554. An ECC check/generator unit 554a generates an ECC using the data 525 and compares the generated ECC against the existing ECC 523 associated with the data. In this example, a 4-Byte ECC is generated for the 64 Bytes of data 525. However, the underlying principles of the invention are not limited to any particular type or size of ECC. Additionally, it should be noted that the term "data" is used broadly herein to refer to both executable program code and data, both of which may be stored in the data storage 525 shown in FIG. 5D.

In one embodiment, a 3-Byte (24-bit) tag 522 is used with the bit assignments illustrated in FIG. 5D. Specifically, bits 00 to 16 are address bits which provide the upper address bits of the cache line. For a system address having 56 bits (e.g., SPA [55:00]), bits 00 to 16 map to bits 55-29 of the system address, allowing for the smallest cache size of 512 MB. Returning to the 3-Byte tag, bits 17-19 are reserved; bits 20-21 are directory bits which provide information on remote CPU caching of the cache line (e.g., providing an indication as to the other CPUs on which the line is cached); bits 21-22 indicate the current state of the cache line (e.g., 00=clean; 01=dirty; 10 and 11=unused); and bit 23 indicates whether the cache line is valid (e.g., 1=valid; 0=invalid).

Utilizing a direct-mapped cache architecture as described above, which allows the near memory address to be directly extracted from the system memory address reduces or eliminates the latency cost of looking up the tag store before the MSC 510 can be read, thereby significantly improving performance. Moreover, the time to check the cache tags to decide if the MSC 510 has the required data is also eliminated as it is done in parallel with the ECC check of the data read form the MSC.

Under certain conditions, storing tags with the data may create an issue for writes. A write first reads the data in order to ensure that it does not over-write data for some other address. Such a read before every write could become costly. One embodiment of the invention employs a dirty line tag cache that maintains the tags of recently-accessed near memory addresses (NMAs). Since many writes target recently accessed addresses, a reasonably small tag cache can get an effective hit rate to filter most of the reads prior to a write.

Figure 5E:
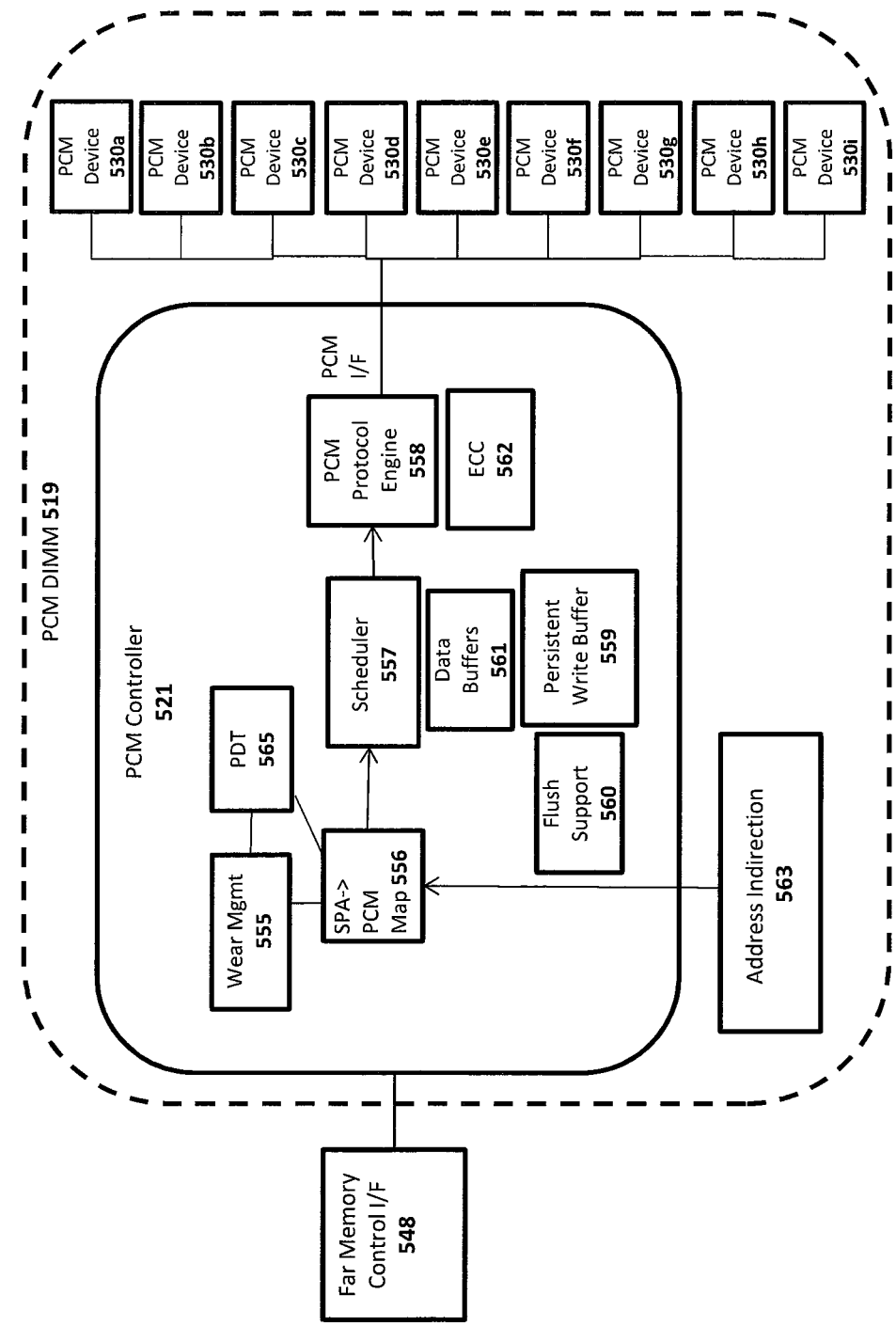
FIG. 5E illustrates one embodiment of a PCM DIMM including a PCM controller.

Additional details associated with one embodiment of a PCM DIMM 519 including a PCM far memory controller 521 and a set of PCM far memory modules 530a-i is illustrated in FIG. 5E. In one embodiment, a single pool of PCM far memory 530a-i is dynamically shared between system memory and storage usages. In this embodiment, the entire PCM pool 530a-i may be subdivided into "blocks" of 4 KB size. A PCM Descriptor Table (PDT) 565 identifies the use of each PCM block as either memory or storage. For example, each row of the PDT may represent a particular block with a particular column identifying the use of each block (e.g., 1=memory; 0=storage). In this embodiment, an initial system configuration can partition the PCM blocks within the PCM 530a-i between storage and memory use (i.e., by programming the PDT 565). In one embodiment, the same table is used to exclude bad blocks and provide spare blocks for wearing-leveling operations. In addition, the PDT 565 may also include the mapping of each PCMS block to a "logical" block address used by software. In the case of System Memory, the logical block address is the same as the MCA or SPA. This association is needed to update the Address Indirection Table (AIT) 563 whenever the PCMS block is moved due to wear leveling. When this happens the logical block address used by software has to be mapped to a different PCMS Device Address (PDA). In one embodiment, this mapping is stored in the AIT and is updated on every wear-level move.

As illustrated, the PCM controller 521 includes a system physical address (SPA)-to-PCM mapper 556 which operates in response to a wear management unit 555 and an address indirection unit 563 to map SPAs to PCM blocks. In one embodiment, the wear management logic 555 implements a wear leveling algorithm to account for the fact that the storage cells of the PCM 530a-530i begin to wear out after too many write and/or erase accesses. Wear leveling spreads writes and erases across the PCM device's memory cells by, for example, forcing data blocks with low cycle counts to occasionally move, and thereby allowing high cycled data blocks to be placed in memory cells that stored the low cycled data blocks. Typically, the majority of blocks do not cycle, but high cycle count blocks are most likely to fail and wear leveling swaps addresses of high cycle count blocks with low cycle count blocks. The wear management logic 555 may track the cycle counts using one or more counters and registers (e.g., the counters may increment by one each time a cycle is detected and the result may be stored in the set of registers).

In one embodiment, the address indirection logic 563 includes an address indirection table (AIT) containing an indication of the PCM blocks to which write operations should be directed. The AIT may be used to automatically move blocks between memory and storage usages. From the software perspective, the accesses to all the blocks uses traditional memory load/store semantics (i.e., wear leveling and address indirection operations occur transparently to software). In one embodiment, AIT is used to translate the SPA that is generated by software to a PDA. This translation is required as the need to uniformly wear the PCMS devices, the data will need to be moved around in PDA space to avoid any hotspots. When such a move occurs, the relationship between SPA and PDA will change and the AIT will be updated to reflect this new translation.

Following the SPA to PCM mapping, a scheduler unit 557 schedules the underlying PCM operations (e.g., reads and/or writes) to the PCM devices 530a-I and a PCM protocol engine 558 generates the electrical signaling required for performing the read/write operations. An ECC unit 562 performs error detection and correction operations and data buffers 561 temporarily buffer data being read from or written to the PCM devices 530a-I. A persistent write buffer 559 is used to hold data that is guaranteed to be written back to PCMS even in the event of an unexpected power failure (e.g., it is implemented using non-volatile storage). Flush support logic 560 is included to flush the persistent write buffers to PCMS, either periodically and/or according to a specified data flushing algorithm (e.g., after the persistent write buffers reach a specified threshold).

In one embodiment, the MSC 510 automatically routes storage accesses directly to the PCM far memory controller 521 and memory accesses to the MSC cache control unit 512. Storage accesses coming to the PCM far memory controller 521 are treated as regular reads and writes and the address indirection and wear leveling mechanisms described herein are applied as usual. An additional optimization is employed in one embodiment of the invention which can be implemented when data needs to move between storage and memory. Since a common PCM pool 530a-I is used, data movement can be eliminated or deferred by simply changing the pointers in the translation tables (e.g., the AIT). For example, when data is transferred from storage to memory, a pointer identifying the data in a particular physical PCM storage location may be updated to indicate that the same physical PCM storage location is now a memory location in system memory. In one embodiment, this is done by hardware in a software-transparent manner to provide both performance and power benefits.

In addition to the software-transparent mode of operation, one embodiment of the MSC controller 512 provides alternate modes of operations as indicated by the MSC range registers (RRs) 545. These modes of operation may include, but are not limited to the following:

1) Direct access of PCM memory for storage class applications. Such usage will also require the MSC controller 512 to ensure that writes submitted to PCM 519 are actually committed to a persistent state.

2) Hybrid use of the near memory 518, exposing portions of it to software for direct use while maintaining the remaining as an MSC. When a portion of near memory 518 is exposed to software for direct use, that portion is directly addressable within the system address space. This allows certain applications to explicitly split their memory allocation between a high-performance small region (the near memory 518) and a relatively lower performance bulk region (the far memory 530). By contrast, the portion allocated as a cache within the MSC does not form part of the system address space (but instead acts as a cache for far memory 530 as described herein).

As previously discussed, the MSC architecture is defined such that several different system partitioning approaches are possible. These approaches fall into two broad buckets:

(1) Split Architecture:

In this scheme the MSC controller 512 is located in the CPU and intercepts al system memory requests. There are two separate interfaces from the MSC that exit the CPU to connect to the Near Memory (e.g., DRAM) and Far memory (e.g., PCM). Each interface is tailored for the specific type of memory and each memory can be scaled independently in terms of performance and capacity.

(2) Unified Architecture:

In this scheme a single memory interface exits the CPU and all memory requests are sent to this interface. The MSC controller 512 along with the Near Memory (e.g., DRAM) and Far Memory (e.g., PCM) subsystem are consolidated external to the CPU on this single interface. In one embodiment, this memory interface is tailored to meet the memory performance requirements of the CPU and supports a transactional, out-of-order protocol. The Near and Far memory requirements are met in a "unified" manner on each of these interfaces.

Within the scope of the above buckets several different portioning options are feasible some of which are described below.

(1) Split Example:

Near Memory: DDR5 DIMM's

Near Memory Interface: One or more DDR5 channels

Far Memory: PCM controller/device on a PCI express (PCIe) card

Far Memory Interface: ×16 PCIe, Gen 3

2) Unified Example:

CPU Memory Interface: one or more KTMI (or QPMI) channels

Near/Far Memory with MSC/PCM Controller on a Riser Card
Near Memory Interface off MSC/PCM Controller: DDR5 Interface
Far Memory Interface off MSC/PCM Controller: PCM Device Interface Embodiments Having Different Near Memory Modes of Operation As discussed above, a two-level memory hierarchy may be used for introducing fast non-volatile memory such as PCM as system memory while using a very large DRAM-based near memory. The near memory may be used as a hardware-managed cache. However, some applications are not hardware cache-friendly and, as such, would benefit from alternate ways to use such memory. Because there may be several different applications running on a server at any given time, one embodiment of the invention allows multiple usage modes to be enabled concurrently. Additionally, one embodiment provides the ability to control the allocation of near memory for each of these usage modes.

In one embodiment, the MSC controller 512 provides the following modes for using near memory. As previously mentioned, in one embodiment, the current mode of operation may be specified by operation codes stored in the MSC range registers (RRs) 545.

(1) Write-Back Caching Mode:
In this mode, all or portions of the near memory 518 is used as a cache for the PCM memory 530. While in write-back mode, every write operation is directed initially to the near memory 518 (assuming that the cache line to which the write is directed is present in the cache). A corresponding write operation is performed to update the PCM far memory 530 only when the cache line within the near memory 518 is to be replaced by another cache line (in contrast to write-through mode described below in which each write operation is immediately propagated to the far memory 530).

In one embodiment, a read operation will first arrive at the MSC cache controller 512 which will perform a look-up to determine if the requested data is present in the PCM far memory 518 (e.g., utilizing a tag cache 511). If present, it will return the data to the requesting CPU, core 501 or I/O device (not shown in FIG. 5A). If the data is not present, the MSC cache controller 512 will send the request along with the system memory address to the PCM far memory controller 521. The PCM far memory controller 521 will translate the system memory address to a PCM physical device address (PDA) and direct the read operation to this region of the far memory 530. As previously mentioned this translation may utilize an address indirection table (AIT) 563 which the PCM controller 521 uses to translate between system memory addresses and PCM PDAs. In one embodiment, the AIT is updated as part of the wear leveling algorithm implemented to distribute memory access operations and thereby reduce wear on the PCM FM 530.

Upon receiving the requested data from the PCM FM 530, the PCM FM controller 521 returns the requested data to the MSC controller 512 which stores the data in the MSC near memory 518 and also sends the data to the requesting processor core 501, or I/O Device (not shown in FIG. 5A). Subsequent requests for this data may be serviced directly from the near memory 518 until it is replaced by some other PCM FM data.

In one embodiment, a memory write operation also first goes to the MSC controller 512 which writes it into the MSC near memory acting as a FM cache 518. In this embodiment, the data may not be sent directly to the PCM FM 530 when a write operation is received. For example, the data may be sent to the PCM FM 530 only when the location in the MSC near memory acting as a FM cache 518 in which the data is stored must be re-used for storing data for a different system memory address. When this happens, the MSC controller 512 notices that the data is not current in the PCM FM 530 and will thus retrieve it from near memory acting as a FM cache 518 and send it to the PCM FM controller 521. The PCM controller 521 looks up the PDA for the system memory address and then writes the data to the PCM FM 530.

(2) Near Memory Bypass Mode:
In this mode all reads and writes bypass the NM acting as a FM cache 518 and go directly to the PCM far memory 530. Such a mode may be used, for example, when an application is not cache friendly or requires data to be committed to persistence at the granularity of a cache line. In one embodiment, the caching performed by the processor caches 503 and the NM acting as a FM cache 518 operate independently of one another. Consequently, data may be cached in the NM acting as a FM cache 518 which is not cached in the processor caches 503 (and which, in some cases, may not be permitted to be cached in the processor caches 503) and vice versa. Thus, certain data which may be designated as "uncacheable" in the processor caches 503 may be cached within the NM acting as a FM cache 518.

(3) Near Memory Read-Cache Write Bypass Mode:
This is a variation of the above mode where read caching of the persistent data from PCM 519 is allowed (i.e., the persistent data is cached in the MSC 510 for read-only operations). This is useful when most of the persistent data is "Read-Only" and the application usage is cache-friendly.

(5) Near Memory Read-Cache Write-Through Mode:
This is a variation of the previous mode, where in addition to read caching, write-hits are also cached. Every write to the MSC near memory 518 causes a write to the PCM far memory 530. Thus, due to the write-through nature of the cache, cache-line persistence is still guaranteed.

(5) Near Memory Direct Access Mode:
In this mode, all or portions of the near memory are directly visible to software and form part of the system memory address space. Such memory may be completely under software control. Any data movement from the PCM memory 519 to this region of near memory requires explicit software copies. Such a scheme may create a non-uniform memory address (NUMA) memory domain for software where it gets much higher performance from near memory 518 relative to PCM far memory 530. Such a usage may be employed for certain high performance computing (HPC) and graphics applications which require very fast access to certain data structures. This near memory direct access mode is equivalent to "pinning" certain cache lines in near memory. Such pinning may be done effectively in larger, multi-way, set-associative caches.

Table A below summarizes each of the above-described modes of operation.

TABLE A

| Mode | Reads | Writes |
|---|---|---|
| Write-Back Cache | Allocate on Miss Writeback on Dirty Evict | Allocate on Miss Writeback on Dirty Evict |
| Cache Bypass | Bypass to Far Memory | Bypass to Far Memory |
| Read Cache/Write Bypass | Allocate on Miss | Bypass to Far Memory Invalidate Cached Line |
| Read Cache/Write | Allocate on Miss | Update only on Hit |

TABLE A-continued

| Mode | Reads | Writes |
| --- | --- | --- |
| Through | | Write through to Far Memory |
| Direct Access | Read Direct from Near Memory No Far Memory Access | Write Direct to Near Memory No Far Memory Access |

The processor and chipset components used to implement the above modes of operation include the following:

(1) A Memory-Side-Cache Controller 512 that manages the near memory in a two layer memory (2LM) hierarchy.

(2) A set of Range Registers 545 (see FIG. 5B) in the memory-side-cache 510 that determines the system address ranges for each of the above-described operating modes.

(3) A mechanism to acknowledge write completions from the PCM memory subsystem 519 to the MSC controller 515.

(5) A mechanism to invalidate lines in the near memory 518.

(5) A flush engine to evict dirty lines to PCM and invalidate in specified regions of the near memory address space.

In one embodiment, the memory ranges for each of the usage modes are contiguous in system address space. However multiple, disjoint, regions may use the same mode. In one embodiment, each mode range register within the set of MSC RRs 545 provides the following information:

(1) the mode of operation (e.g., write-back, near memory bypass mode, etc);

(2) the range base in the system address space (e.g., at 2 MB granularity or greater); and (3) a range mask field which identifies the size of the region.

In one embodiment, the number of modes supported is implementation-specific but it is assumed that only one contiguous system address range is available for each mode of operation. If a near memory direct access range register is specified, then it is assumed that this is will be mapped to a contiguous region starting at the bottom of the near memory address space. Such a contiguous region must be smaller than the size of near memory. Additionally, if any of the caching modes are being used, the direct access region size must be smaller than the near memory size to allow for adequate cache size for the required performance. Such allocation of near memory for various modes may be configurable by the user.

In summary, one embodiment of the invention is implemented in accordance with the following set of operations:

(1) When any Read or Write Access reaches the Memory-Side-Cache controller 512, it checks the Range Registers 545 (FIG. 5B) to determine the current mode of operation.

(2) For any read cache/write bypass access, the MSC controller 512 checks to see if the address is currently cached. If it is, it must invalidate the line before sending the write completion back to the source.

(3) For any Write Bypass direct PCM operation, the MSC Controller 512 awaits a completion back from the PCM controller 521 to ensure that the write is committed to a globally visible buffer.

(4) Any Read or Write to the Direct Access mode space in Near Memory, is directed to the appropriate region of Near Memory. No transactions are sent to the PCM memory.

(5) Any change in the Range Register configuration to increase or decrease any existing region or add a new region, will require flushing of appropriate cached regions to PCM. For example, if software wishes to increase the size of the Direct Access mode region by reducing the Write-Back Cache region, it may do so by first evicting and invalidating the appropriate portion of the Near Memory Region and then changing the Near Memory Direct Access Mode Range Register. The MSC Controller 510 will then know that future caching is done to a smaller Near Memory Address Space.

Figure 6A:
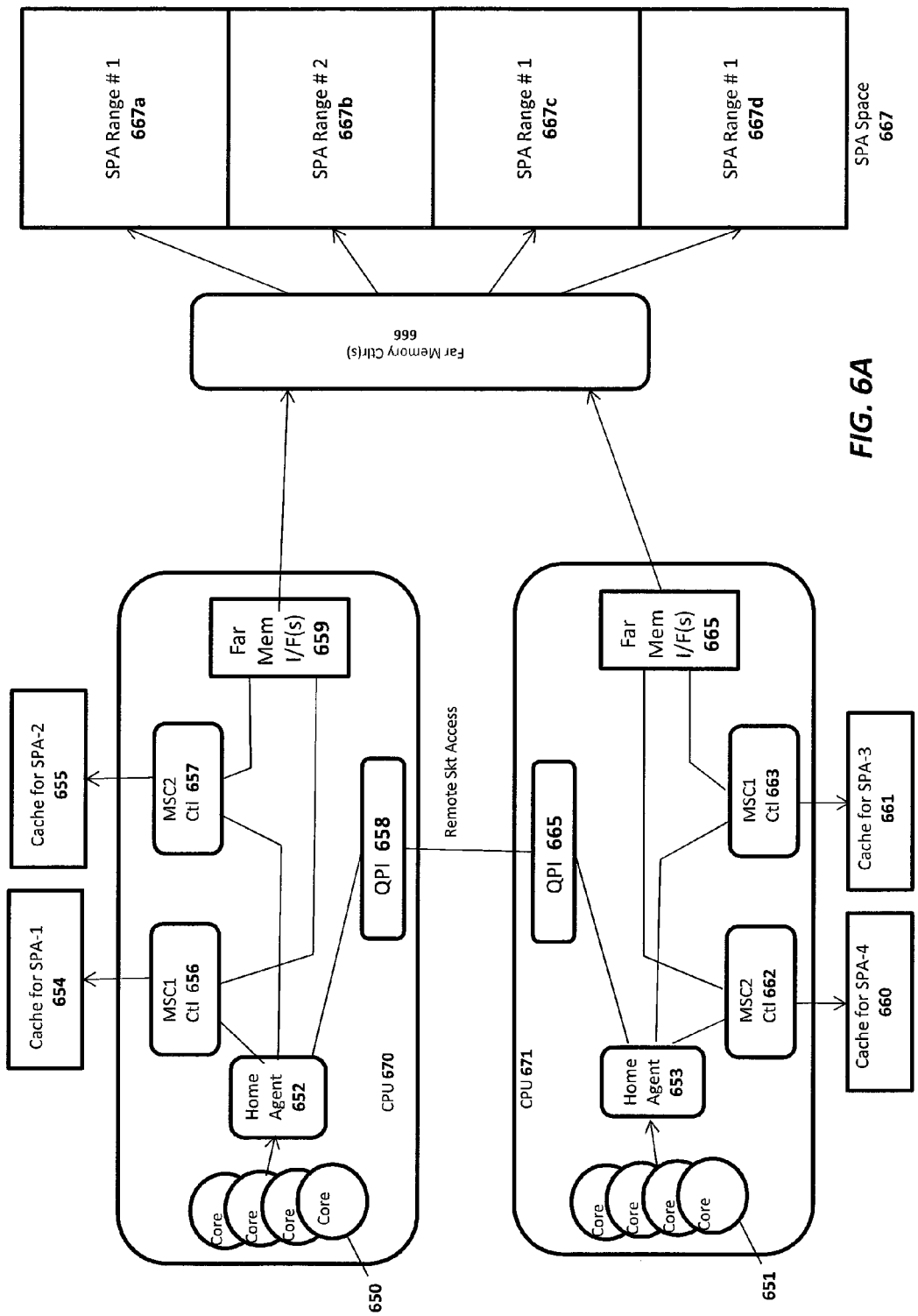
FIG. 6A illustrates MCE controllers and caches dedicated to certain specified system physical address (SPA) ranges according to one embodiment of the invention.

One particular embodiment of the invention in which the system physical address (SPA) space is divided up among multiple MSCs is illustrated in FIG. 6A. In the illustrated embodiment, MSC cache 654 and controller 656 are associated with SPA region 667a; MSC cache 655 and controller 657 are associated with SPA region 667b; MSC cache 661 and controller 663 are associated with SPA region 667c; and MSC cache 660 and controller 662 are associated with SPA region 667d. Two CPUs, 670 and 671, are illustrated, each with four cores, 650 and 651, respectively, and a home agent, 652 and 653, respectively. The two CPUs, 670 and 671, are coupled to a common far memory controller 666 via far memory interfaces, 659 and 665, respectively.

Thus, in FIG. 6A, the entire SPA memory space is subdivided into regions, with each region being associated with a particular MSC and controller. In this embodiment, a given MSC may have a non-contiguous SPA space allocation but no two MSCs have will have overlapping SPA space. Moreover, the MSCs are associated with non-overlapping SPA space and no inter-MSC coherency techniques are required.

Any of the near memory modes described above may be employed on the architecture shown in FIG. 6A. For example, each MSC controller 656-657, 662-663 may be configured to operate in Write-Back Caching Mode, Near Memory Bypass Mode, Near Memory Read-Cache Write Bypass Mode, Near Memory Read-Cache Write-Through Mode, or Near Memory Direct Access Mode. As previously discussed, the particular mode is specified within the range register (RR) 655 for each MSC 610.

In one embodiment, different MSCs may concurrently implement different modes of operation. For example, the range registers of MSC controller 656 may specify the Near Memory Direct Access mode, the range registers of MSC controller 657 may specify the Write Back Cache mode, the range registers of MSC controller 662 may specify the Read Cache/Write Bypass mode, and MSC controller 663 may specify the Read Cache/Write Through mode. In addition, in some embodiments, individual MSCs may concurrently implement different modes of operation. For example, MSC controller 656 may be configured to implement near memory direct access mode for certain system address ranges and a near memory bypass mode for other system address ranges.

The foregoing combinations are, of course, merely illustrative of the manner in which MSC controllers may be independently programmed. The underlying principles of the invention are not limited to these or any other combinations.

As described with respect to some of embodiments described above (e.g., such as that described with respect to FIG. 4G), an MSC and its MSC controller are configured to operate on the same memory channel (e.g., the same physical DDR bus) as the PCM DIMM responsible for that particular SPA range. Consequently, in this embodiment, memory transactions which occur within the designated SPA range are localized within the same memory channel, thereby reducing data traffic through the CPU mesh interconnect.

Figure 6B:
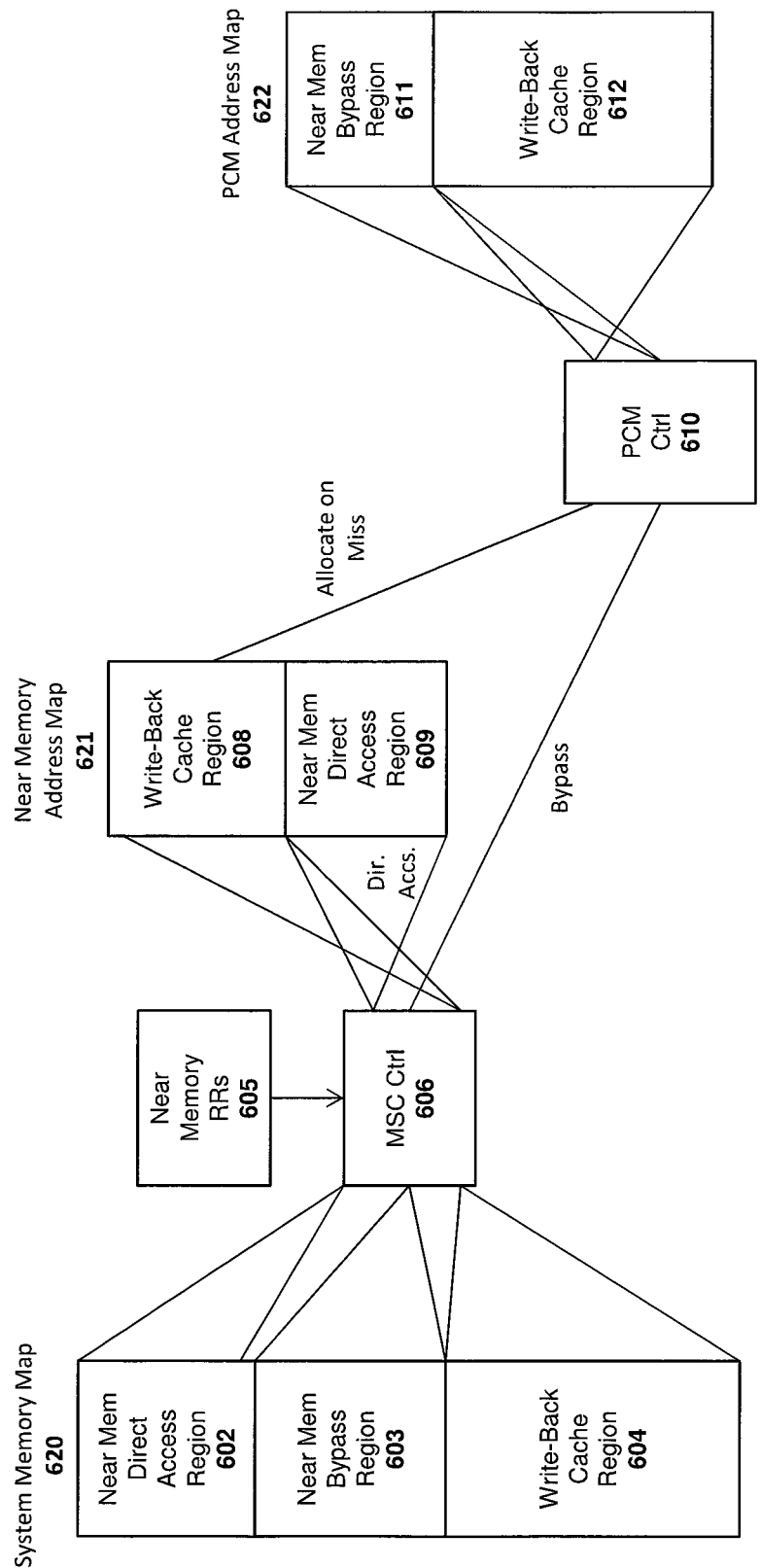
FIG. 6B illustrates an exemplary mapping between a system memory map, a near memory address map and a PCM address map according to one embodiment of the invention.

FIG. 6B provides a graphical representation of how the system memory address map 620, near memory address map 621 and PCM address map 622 may be configured in accordance with embodiments of the invention. As previously discussed, the MSC controller 606 operates in a mode identified by the range registers (RRs) 605. System memory map 620 has a first region 602 allocated for near memory direct access mode, a second region 603 allocated for near memory bypass mode, and a third region 605 allocated for write-back cache mode. The MSC controller 606 provides access to the near memory as indicated by near memory address map 621, which includes a first region 608 allocated to a Write Back Cache mode, and a second region 609 allocated to a Near Memory Direct Access Mode. As illustrated, Near Memory Cache Bypass operations are provided directly to the PCM controller 610 operating in accordance with the PCM address map 622, which includes a Near Memory Bypass region 611 (for Near Memory Bypass mode) and a Write-Back Cache region 612 (for Write-Back Cache mode). Consequently, the system memory map 620, near memory address map 621 and PCM address map 622 may be subdivided based on the specific modes implemented by the MSC controllers.

Figure 6C:
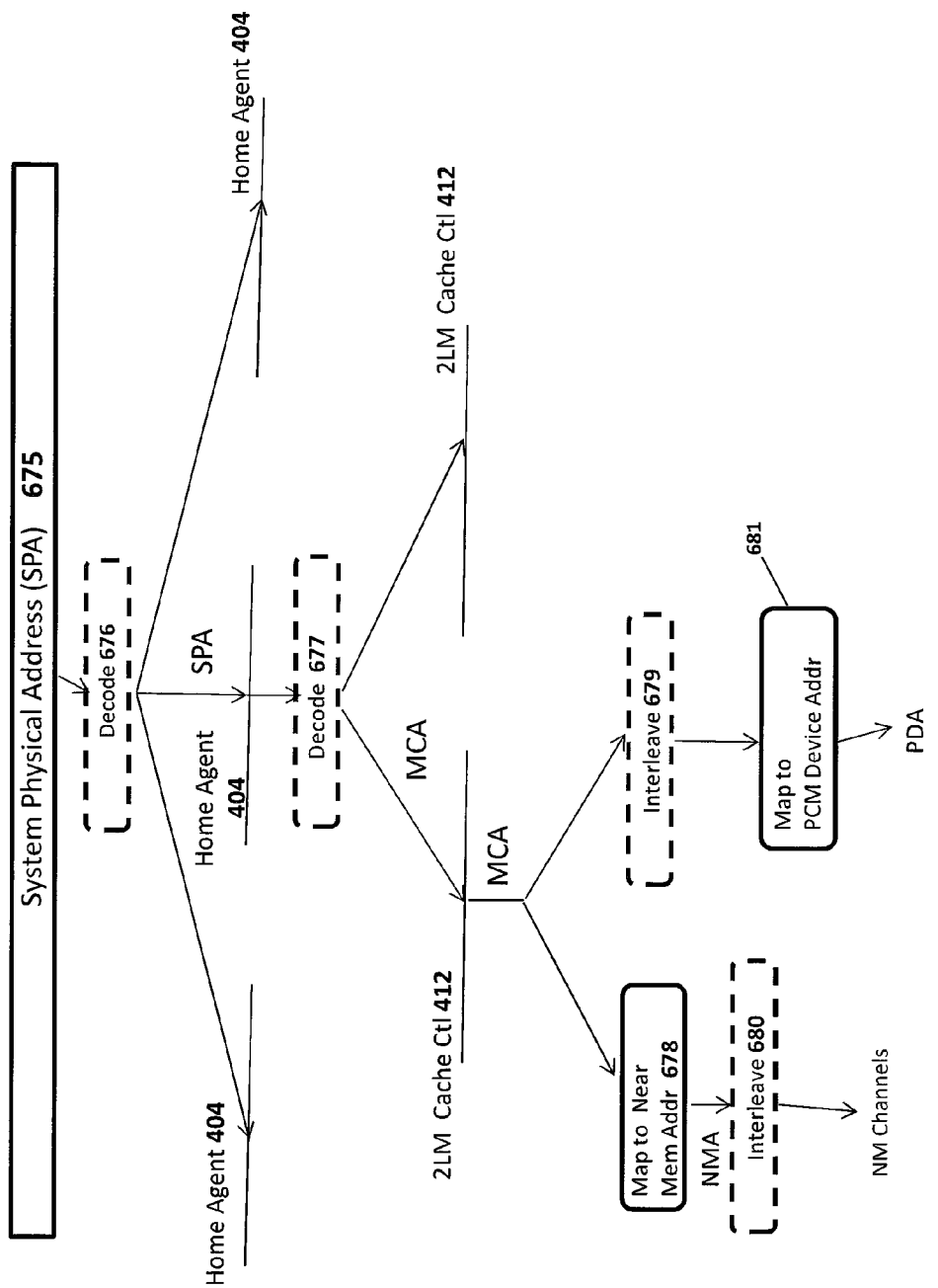
FIG. 6C illustrates an exemplary mapping between a system physical address (SPA) and a PCM physical device address (PDA) or a near memory address (NMA) according to one embodiment of the invention.
Figure 6D:
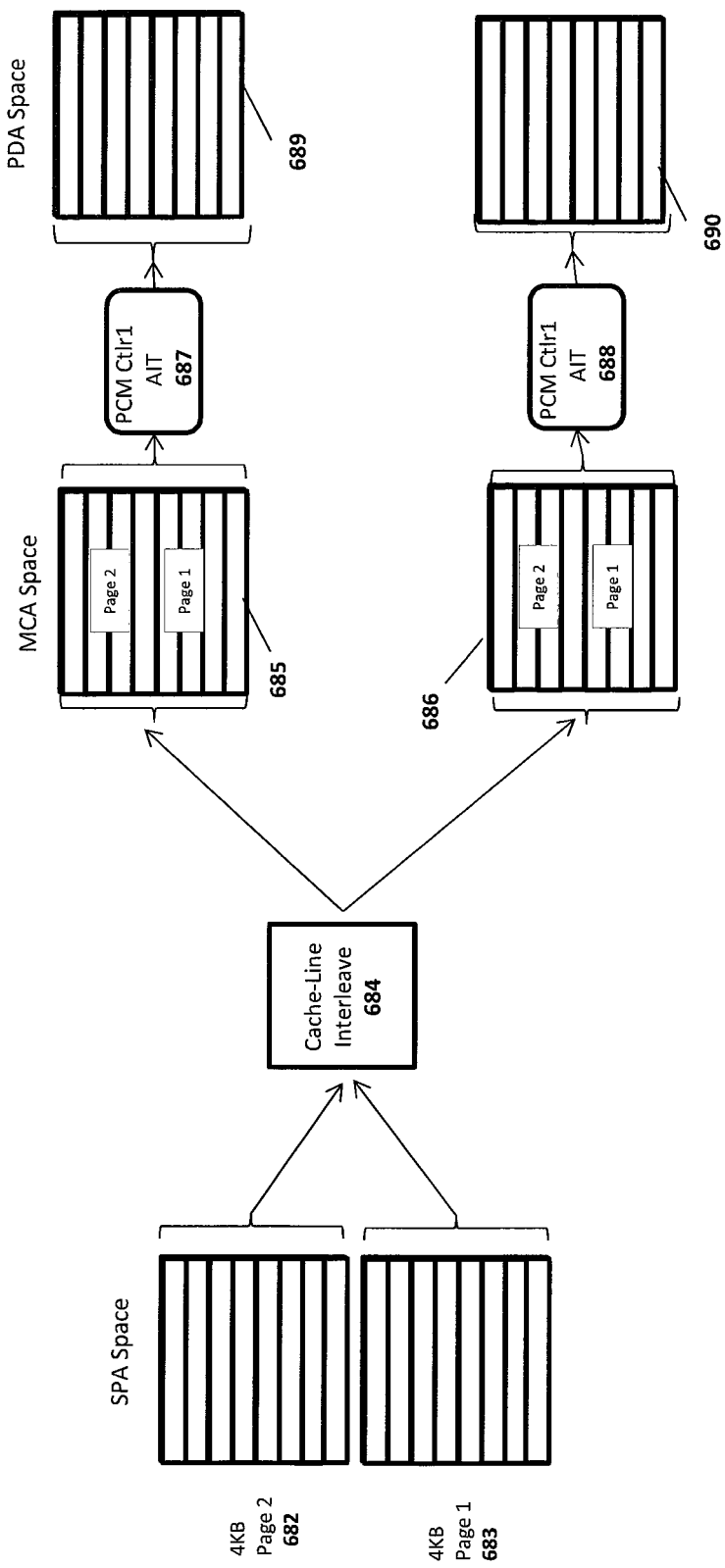
FIG. 6D illustrates interleaving between memory pages within a system physical address (SPA) space and memory channel address (MCA) space according to one embodiment of the invention.

FIGS. 6C and 6D illustrate addressing techniques employed in one embodiment of the invention (some of which may have already been generally described). In particular, FIG. 6C shows how a system physical address (SPA) 675 maps to a near memory address (NMA) or a PCM device address (PDA). In particular, the SPA is first decoded by decode logic 676 within a processor to identify a home agent 605 (e.g., the home agent responsible for the decoded address space). Decode logic 677 associated with the selected home agent 605 further decodes the SPA 675 (or portion thereof) to generate a memory channel address (MCA) identifying an appropriate MSC cache controller 612 allocated to that particular SPA space. The selected cache controller 612 then either maps the memory access request to a near memory address at 678, followed optionally by an interleaving operation at 680 (described below) or, alternatively performs an optional interleaving operation at 679, followed by mapping 681 by the PCM far memory controller to a PCM device address PDA (e.g., using address indirection and wear management as described above).

One embodiment of an optional interleaving process is illustrated in FIG. 6D which shows how software pages can be broken up across multiple MSCs and PCM address spaces using interleaving. In the example shown in FIG. 6D, two pages 682-683 within the SPA space are interleaved by cache-line interleave logic 685 to generate two sets of interleaved lines 685-686 within the MCA space. For example, all of the odd lines from the memory pages 682-683 (e.g., lines 1, 3, 5, etc.) may be sent to a first MCA space 685, and all of the even lines from the memory pages 682-683 (e.g., lines 2, 5, 6, etc.) may be sent to a second MCA space 686. In one embodiment, the pages are 5 KByte pages, although the underlying principles of the invention are not limited to any page size. PCM controllers 687-688 operating in accordance with Address Indirection Tables (AITs) and wear management logic then rearrange the cache lines within the PCM device address (PDA) memory space (as described above). Interleaving of this nature may be used to distribute the workload across MSCs 610 and/or PCM devices 619 (e.g., as an alternative to non-uniform memory address (NUMA)).

System and Method for Intelligently Flushing Data from a Processor into a Memory Subsystem In current processor designs, when the processor cache is flushed, no information is provided to the memory subsystem to differentiate between data which is no longer needed by the processor (and can therefore be discarded) and data which should be saved. As a result, all flushed data is saved. The performance of new architectures such as those which employ PCM or, more specifically, PCMS memory may be improved if such information is provided to the memory subsystem. For example, such information may be used to reduce the number of writes to reduce wear on the PCMS memory, particularly when used in combination with existing wear leveling techniques.

Wear leveling was previously discussed in detail with respect to FIG. 5E, which shows a PCM controller 521 (a PCMS controller in one embodiment) with a system physical address (SPA)-to-PCM mapper 556 operating in response to a wear management unit 555 and an address indirection unit 563 to map SPAs to PCM blocks. In one embodiment, the wear management logic 555 implements a wear leveling algorithm to account for the fact that the storage cells of the PCM 530a-530i begin to wear out after too many write and/or erase accesses. Wear leveling spreads writes and erases across the PCM device's memory cells by, for example, forcing data blocks with low cycle counts to occasionally move, and thereby allowing high cycled data blocks to be placed in memory cells that stored the low cycled data blocks. Typically, the majority of blocks do not cycle, but high cycle count blocks are most likely to fail and wear leveling swaps addresses of high cycle count blocks with low cycle count blocks. The wear management logic 555 may track the cycle counts using one or more counters and registers (e.g., the counters may increment by one each time a cycle is detected and the result may be stored in the set of registers).

In one embodiment, the address indirection logic 563 includes an address indirection table (AIT) containing an indication of the PCM blocks to which write operations should be directed. The AIT may be used to automatically move blocks between memory and storage usages. From the software perspective, the accesses to all the blocks uses traditional memory load/store semantics (i.e., wear leveling and address indirection operations occur transparently to software). In one embodiment, AIT is used to translate the SPA that is generated by software to a PDA. This translation is required as the need to uniformly wear the PCMS devices, the data will need to be moved around in PDA space to avoid any hotspots. When such a move occurs, the relationship between SPA and PDA will change and the AIT will be updated to reflect this new translation.

In one embodiment, read and write data buffers 561 are used to read data from PCMS 530a-I and write data to the PCMS to maximize the life of the PCMS parts, to increase read/write bandwidth and to reduce power. If cache flush information as described herein is not provided to the PCM controller 521 it cannot differentiate between the data that are no longer needed by the processor and data which are currently in use, thereby reducing the performance of the PCMS memory 530a-i.

The embodiments of the invention described herein provide techniques for communicating memory flush information to the memory subsystem to improve performance of the PCMS memory by reducing the number of writes to PCMS. The memory flush information also ensures that data which needs to be saved is written to the PCMS memory controller rather than remaining in the PCMS buffer during a power cycle.

One embodiment of the invention uses the memory range registers 545 previously described with respect to FIGS. 5B-C to differentiate between DRAM (e.g., DDR) memory and memory with a buffer interface 561 such as the PCMS memory controller 521. In one embodiment, when a range register indicates that a PCMS device is used to store a particular set of cached data, the processor generates memory flush "hints" to the memory subsystem when the processor cache is implicitly or explicitly flushed or when a memory flush is requested. In one embodiment, the hints are provided to the PCM controller 521 over a QuickPath Interconnect (QPI) interface (a point-to-point processor interconnect designed by the assignee of the present application which replaces the front side bus (FSB) in certain processor architectures). It should be noted, however, that the underlying principles of the invention are not limited to any particular type of interface for exchanging data between a processor and a memory subsystem. The memory subsystem then uses the memory flush hints to manage buffering of the memory, ensuring that data is written to PCMS memory only when necessary.

In one embodiment, a bit is added to the memory range registers 545 or, alternatively, the memory type range registers (MTRRs) used in some processors to identify access modes to certain memory ranges such as uncached (UC), write-through (WT), write combining (WC), write-protect (WP), and write-back (WB). The new bit is used to indicate whether to send memory flush data to the memory controller. In one embodiment, when the processor flushes a memory region associated with memory flush hint range, the processor sends additional information to the memory controller including the memory flush hint. When the memory controller receives the memory flush hint, it writes the buffered data back to the PCMS memory controller 521 (or actual PCMS memory 530*a-i*). By way of example, and not limitation, the processor may use a special memory flush page instruction (MFLUSH) identifying a memory page to be flushed and concurrently (or subsequently) provide a memory flush hint to the memory controller in which the memory page resides.

Figure 7:
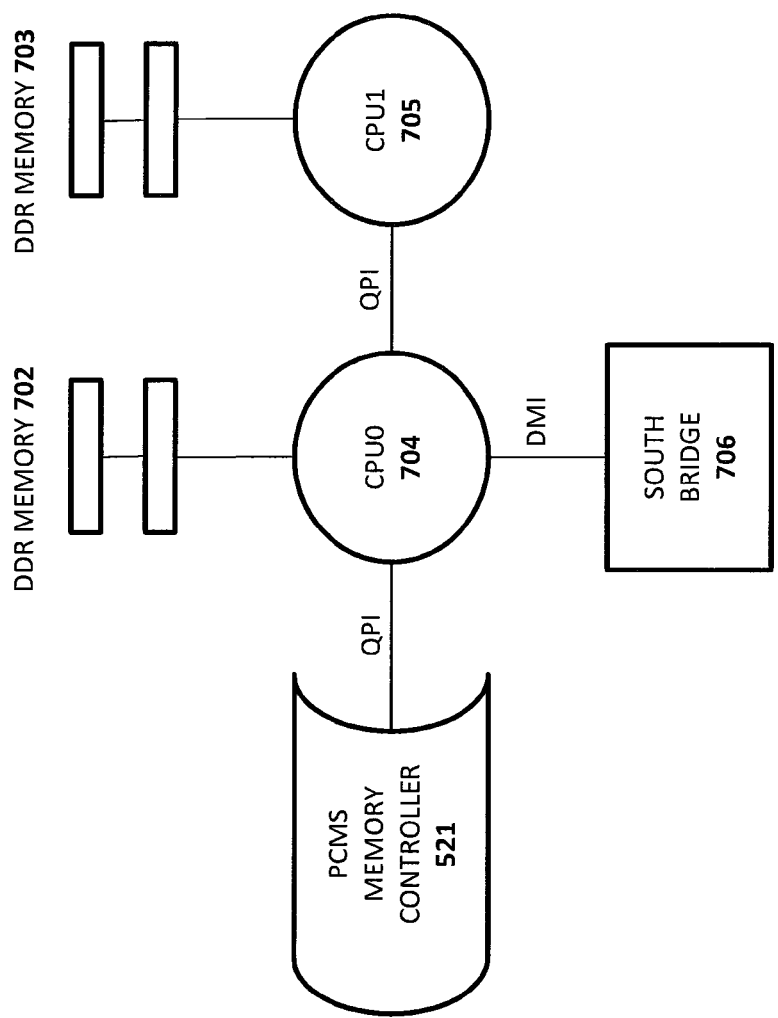
FIG. 7 illustrates an exemplary multi-processor architecture on which embodiments of the invention may be implemented.

FIG. 7 illustrates an exemplary architecture which includes multiple CPUs 704-705 communicating with one another and with a PCMS memory controller 521 over a QPI interface. A south bridge module 706 is communicatively coupled to the CPUs via a direct media interface (DMI). In addition, each processor is communicatively coupled to its own DDR memory 702-703 (although DDR is not necessarily required for compliance with the underlying principles of the invention).

Figure 8:
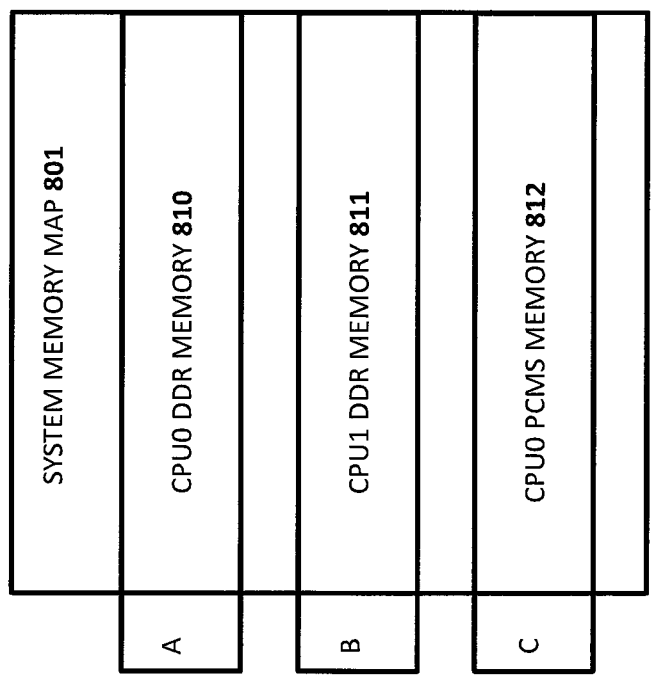
FIG. 8 illustrates a system memory map in accordance with some embodiments of the invention.

FIG. 8 illustrates an exemplary system memory map 801 for the system shown in FIG. 7 which includes an entry 810 mapping a first range of system memory addresses to DDR memory 702; an entry 811 mapping a second range of system memory addresses to DDR memory 703; and an entry 812 mapping a third range of system addresses to PCMS memory 521.

Figure 9:
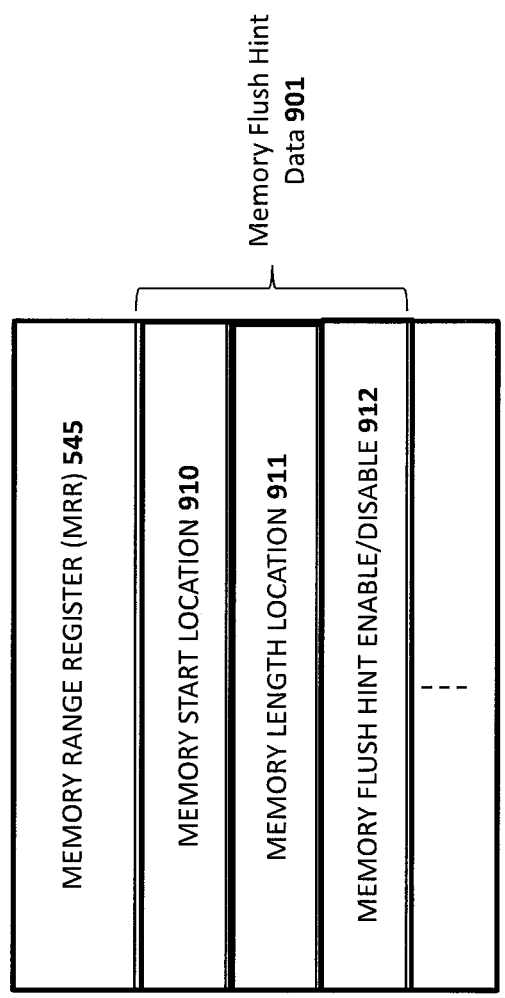
FIG. 9 illustrates one embodiment of a memory range register (MRR) containing flush hint data.

FIG. 9 illustrates an exemplary Memory Range Register 545 containing memory flush hint data 901 in accordance with one embodiment of the invention. In the illustrated implementation, the memory flush hint data 901 includes a memory start location 910 providing the address of the start of the memory region for which the memory flush hint is provided, a memory length location 911 specifying a length of the memory region for which the memory flush hint is provided, and a memory flush enable/disable bit 912 indicating whether the memory region identified by the memory start location 910 and memory length location 911 must be stored to PCMS memory in response to a flush condition. In one embodiment, when the memory flush hint is enabled for a given memory range, the CPU sends memory flush hints to the memory subsystem. The memory flush hints may be generated either through explicit invocation by software or as part of the CPU eviction algorithm.

Figure 10:
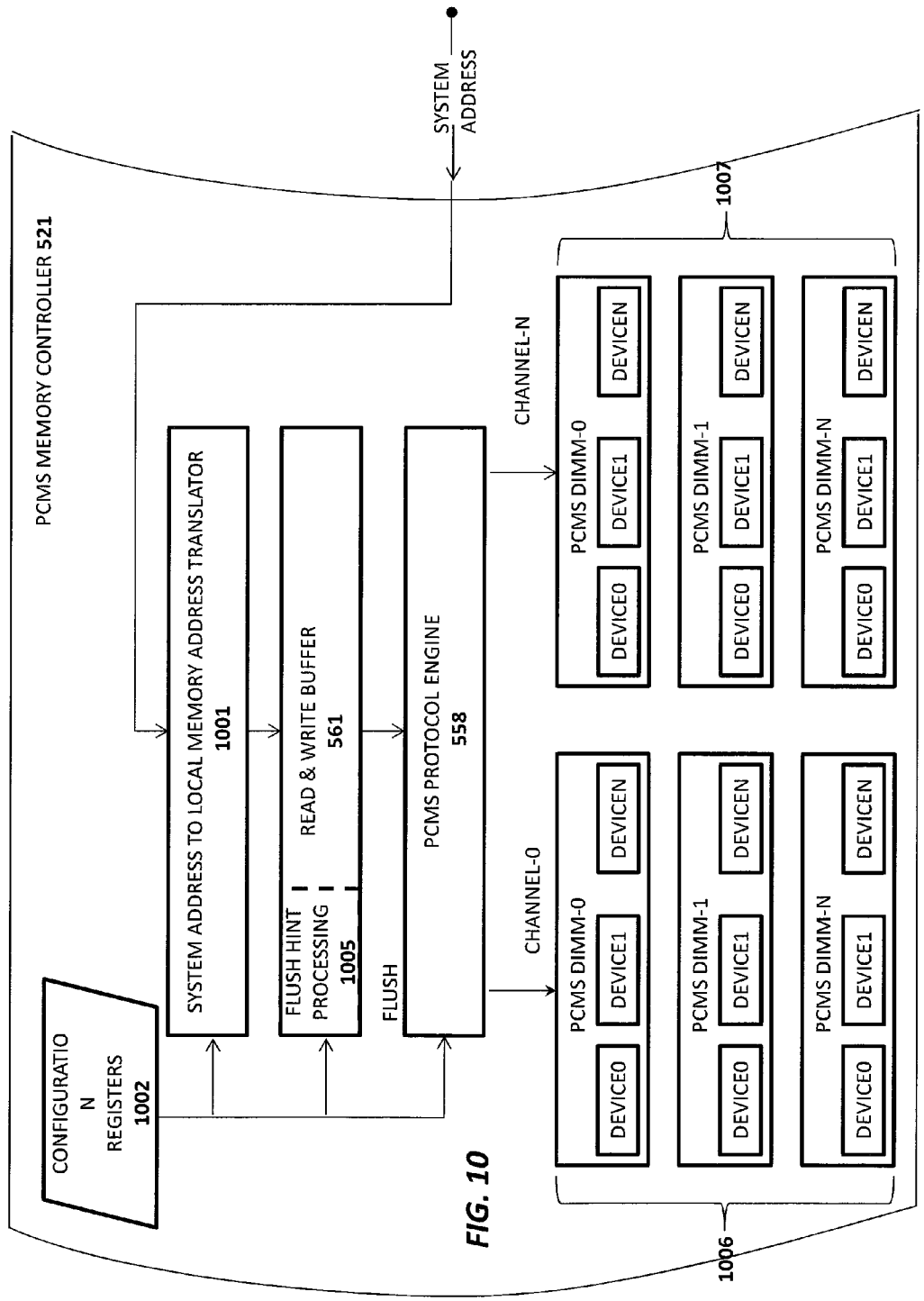
FIG. 10 illustrates one embodiment of a PCMS memory controller.

FIG. 10 illustrates a PCMS memory controller 521 in accordance with one embodiment of the invention which includes a system address to local memory address translator 1001 for translating system addresses to PCMS device addresses. In one embodiment, the system address to local memory address translator 1001 illustrated in FIG. 10 includes the system physical address to PCMS address map module 556 and address indication module 563 illustrated in FIG. 5E. Additionally, in one embodiment, a set of configuration registers 1002 include the memory range registers 545 for specifying whether flush hints will be provided for the various system address ranges as described herein.

Also illustrated in FIG. 10 is a read and write buffer and a PCMS protocol engine (both of which have been previously described with respect to FIG. 5E). Two separate memory channels are illustrated in FIG. 10 (channels 0 and 1) each of which has N PCMS DIMMs. For example, DIMMs 1006 are assigned to memory channel 0 and DIMMs 1007 are assigned to memory channel 1. Of course, the underlying principles of the invention are not limited to any particular configuration of DIMMs and memory channels.

In one embodiment of the invention, flush hint processing logic 1005 associated with the read and write buffer 561 makes use of the memory flush hint to decide whether to flush the data from buffer to the PCMS DIMMs 1006-1007 or to maintain the data in the buffer.

Figure 11:
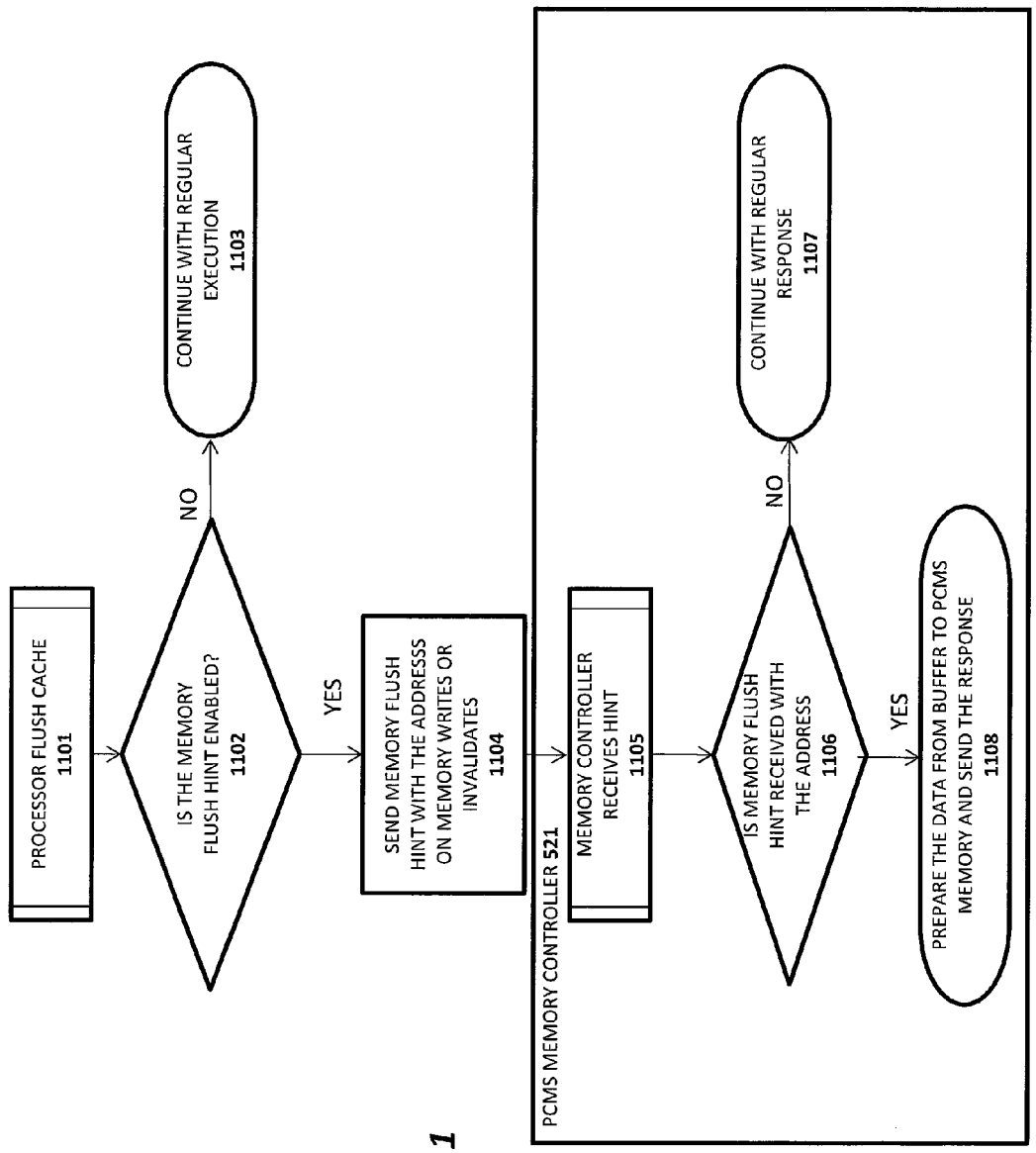
FIG. 11 illustrates one embodiment of a method for intelligently flushing data to a PCMS device.

FIG. 11 illustrates one embodiment of a method for using memory flush hints. At 1101 the processor flushes its cache and, at 1102, a determination is made as to whether the memory flush hint is enabled (e.g., via a bit in the MRR or MTRR). If not, then at 1103, the system continues execution without the use of hints. If so, then at 1104, a memory flush hint containing the address for memory writes or invalidate operations is sent to the PCMS memory controller.

At 1105, the memory controller receives the memory flush hint from the processor and at 1106 a determination is made as to whether the memory flush hint is received with the address. If not, then a regular response is sent to the processor at 1107. For example, a regular response according to one embodiment is posted writes, were the acknowledgement is send immediately after receiving the data back to the sender. When the memory flush hint is received, the memory is written back to the PCMS and then the acknowledgement is sent to the sender. If so, then at 1108, the data stored in the PCMS buffer is saved to PCMS memory in accordance with the memory flush hint (e.g., as described above).

In embodiments in which the MFLUSH instruction is used, it may be designed as a blocking call if a persistent store is a required. Performing a memory flush on the entire PCMS address range will ensure that all the data in the PCMS memory is returned back to the PCMS memory devices. Here the operations to flush the PCMS memory address range may be specified with a memory fence instruction (MFENCE) followed by a MFLUSH instruction indicating a specific page number.

The embodiments of the invention described above communicate memory flush information to the memory subsystem to improve performance of the PCMS memory by reducing the number of writes to PCMS. These embodiments also ensure that data which needs to be saved is written to the PCMS memory controller (rather than remaining in the PCMS buffer during a power cycle).

In one embodiment, one or more range registers (RRs) are added to the memory controller logic of the processor (integrated in the processor package or a separate silicon) where the range indicates the address space of the processor's byte addressable persistent memory. For writes that target the persistent memory space as determined by aforementioned range registers, the memory controller logic ensures that the writes indeed are persistent (i.e., the PCMS controller returns an acknowledge indicating that the write is persistent). Note that the PCMS controller could also store the write in a power-protected cache before returning the acknowledge and complete the write later to the PCMS memory. This is an implementation choice for the PCM/PCMS controller.

The mechanism by which software assures itself that the writes to persistent memory are indeed persistent is termed as 'durable'. A write to persistent memory is durable at a point when the content of the write will be preserved regardless of power cycle or reset conditions that may occur following the durability point.

Figure 12:
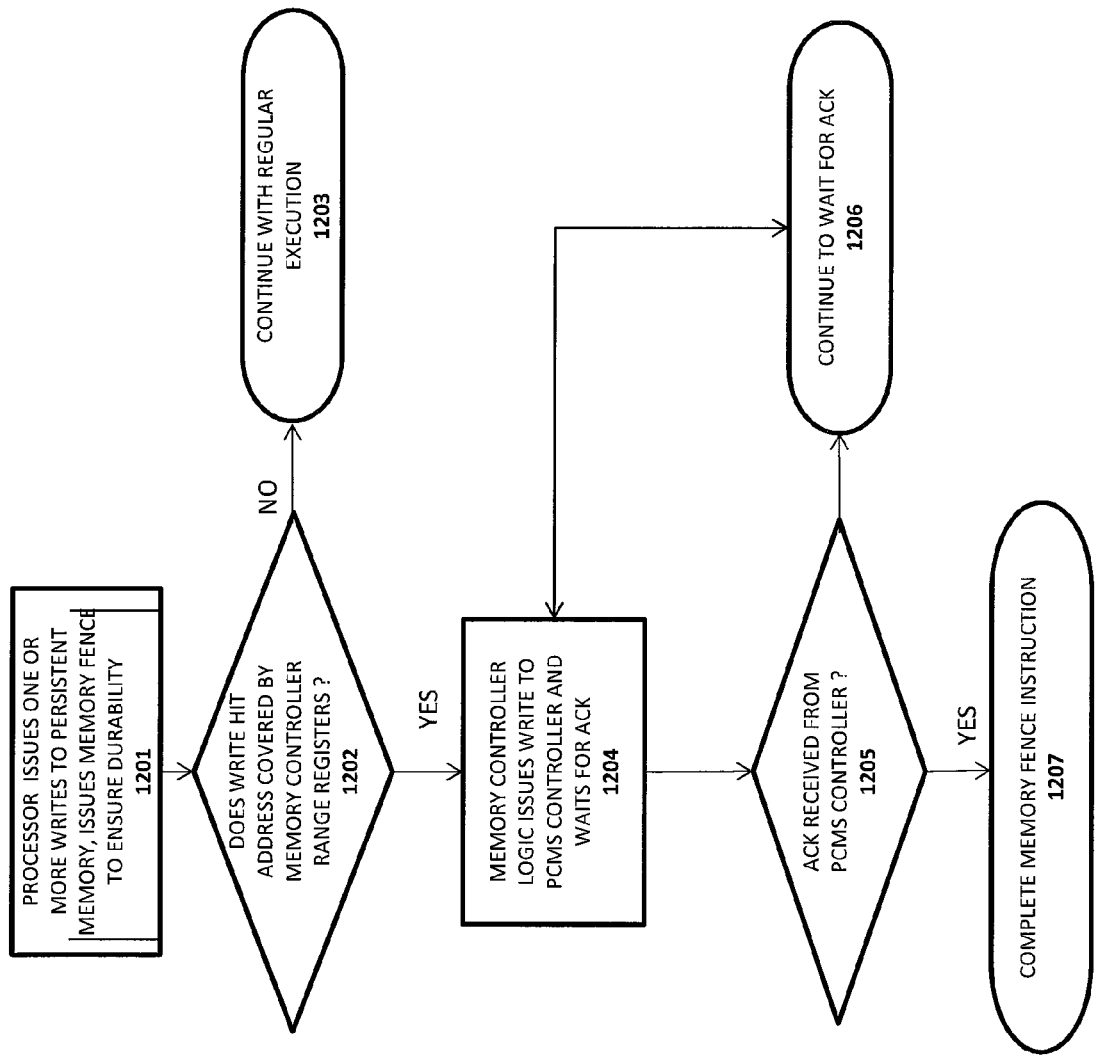
FIG. 12 illustrates a method according to one embodiment of the invention.

In the embodiment where one or more range registers are added to memory controller logic, software can assure itself of durability by issuing a memory fence or a store fence instruction. These fence instructions simply count the outstanding writes from the processor core and wait for completion for writes for the writes from the memory controller logic. Since the memory controller logic will only issue completions if the writes that fall within the range registers have all completed to the corresponding PCMS controller, the completion of fence instruction is indication to software that its writes to persistent memory are durable. This scheme is illustrated in FIG. 12.

At 1201, the processor issues one or more writes to persistent memory and issues memory fence operations to ensure durability. If the write hits an address covered by the memory controller range registers, determined at 1202, then at 1204 the memory controller logic issues a write to the PCMS controller and waits for the acknowledgement. If not, then the processor continues with regular execution at 1203.

When an acknowledgement is received from the PCMS controller, determined at 1205, then at 1207, the processor completes the memory fence operation. The processor waits for the acknowledgement at 1206 to 1204 until the acknowledgement is received.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hardwired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

We claim:

1. A method for utilizing memory flush hints within a computer system comprising:
    flushing data from a processor cache;
    determining whether memory flush hints are enabled for a specified system address range allocated to a persistent memory device;
    if the memory flush hints are enabled for the specified system address range then generating a memory flush hint for a persistent memory controller of the persistent memory device; and
    using the memory flush hint to determine whether to save the flushed data to the persistent memory device.

2. The method as in claim 1 further comprising:
    saving the flushed data to the persistent memory device according to the memory flush hint.

3. The method as in claim 1 wherein the persistent memory device further comprises any of:
    phase change memory;
    universal memory;
    $Ge_2Sb_2Te_5$ memory;
    programmable metallization cell memory;
    resistive memory;
    amorphous cell memory;
    Ovshinsky memory;
    ferroelectric memory;
    ferromagnetic memory;
    spin transfer torque memory;
    spin tunneling memory;
    magnetoresistive memory;
    magnetic memory;
    dielectric memory.

4. The method as in claim 1 wherein if flush hints are not enabled for the specified address range, then saving the flushed data to the persistent memory device.

5. The method as in claim 1 wherein the operation of determining whether memory flush hints are enabled for a specified system address range comprises reading an enable/disable bit stored in a memory range register, the enable/ disable bit having a first value if memory flush hints are enabled and a second value if memory flush hints are not disabled.

6. The method as in claim 1 further comprising:
using an address indirection table (AIT) to identify specific persistent memory blocks corresponding to the specified system address range.

7. The method as in claim 1 further comprising:
specifying a memory channel for the system address range.

8. A system comprising:
a processor having a cache from which data is to be flushed, the data associated with a particular system address range; and
a persistent memory controller to manage access to data stored in a persistent memory device corresponding to the particular system address range;
the processor to determine whether memory flush hints are enabled for the specified system address range, wherein if memory flush hints are enabled for the specified system address range then the processor is to send a memory flush hint to a persistent memory controller of the persistent memory device and wherein the persistent memory controller is to use the memory flush hint to determine whether to save the flushed data to the persistent memory device.

9. The system as in claim 8 wherein the persistent memory further comprises any of:
phase change memory;
universal memory;
Ge2Sb2Te5 memory;
programmable metallization cell memory;
resistive memory;
amorphous cell memory;
Ovshinsky memory;
ferroelectric memory;
ferromagnetic memory;
spin transfer torque memory;
spin tunneling memory;
magnetoresistive memory;
magnetic memory;
dielectric memory.

10. The system as in claim 8 further comprising:
read and write buffers within the persistent memory controller to buffer data to be stored in accordance with the memory flush hints.

11. The system as in claim 8 wherein if flush hints are not enabled for the specified address range, then the persistent memory controller is to save the flushed data to the persistent memory device.

12. The system as in claim 8 comprising:
a memory range register comprising an enable/disable bit to indicate whether memory flush hints are enabled for a specified system address range, the enable/disable bit having a first value if memory flush hints are enabled and a second value if memory flush hints are not disabled.

13. The system as in claim 12 further comprising:
an address indirection table (AIT) to identify specific persistent memory blocks corresponding to the specified system address range.

14. The system as in claim 13 further comprising:
a DIMM memory channel associated with the system address range.

15. A system comprising:
a processor comprising a cache from which data is to be flushed, the data associated with a particular system address range; and
a persistent memory controller to manage access to data stored in a persistent memory device corresponding to the particular system address range;
the processor to send a memory flush hint to the persistent memory controller of the persistent memory device and wherein the persistent memory controller is to use the memory flush hint to determine whether to save the flushed data to the persistent memory device based on an address range or pages specified by an MFLUSH instruction.

16. The system as in claim 15 wherein the persistent memory further comprises any of:
phase change memory;
universal memory;
Ge2Sb2Te5 memory;
programmable metallization cell memory;
resistive memory;
amorphous cell memory;
Ovshinsky memory;
ferroelectric memory;
ferromagnetic memory;
spin transfer torque memory;
spin tunneling memory;
magnetoresistive memory;
magnetic memory;
dielectric memory.

17. The system as in claim 15 further comprising:
read and write buffers within the persistent memory controller to buffer data to be stored in accordance with the memory flush hint.

18. The system as in claim 15 further comprising:
a DIMM memory channel associated with the system address range.

19. The system as in claim 15 wherein a FENCE instruction is to cause the specified memory address range or pages to be flushed from the cache and send the memory flush hint to the persistent memory controller.

20. A method for utilizing memory flush hints within a computer system comprising:
issuing one or more writes to persistent memory;
issuing a memory fence instruction with the one or more writes;
determining whether a write hits an address covered by a memory controller range register;
if so, then issuing a write to a persistent memory controller and waiting for an acknowledgement;
completing the memory fence instruction upon receipt of the acknowledgement.

21. The method as in claim 20 further comprising:
continuing a normal mode of execution if the address is not covered by a range register.

22. The method as in claim 20 wherein the persistent memory further comprises any of:
phase change memory;
universal memory;
Ge2Sb2Te5 memory;
programmable metallization cell memory;
resistive memory;
amorphous cell memory;
Ovshinsky memory;
ferroelectric memory;
ferromagnetic memory;
spin transfer torque memory;
spin tunneling memory;
magnetoresistive memory;
magnetic memory;
dielectric memory.

23. A system comprising:
processor means having a cache from which data is to be flushed, the data associated with a particular system address range; and
a persistent memory controller means to manage access to data stored in a persistent memory device means corresponding to the particular system address range;
the processor means to determine whether memory flush hints are enabled for the specified system address range, wherein if memory flush hints are enabled for the specified system address range then the processor means is to send a memory flush hint to the persistent memory controller means of the persistent memory device means and wherein the persistent memory controller means is to use the memory flush hint to determine whether to save the flushed data to the persistent memory device means.

24. The system as in claim 23 wherein the persistent memory device means further comprises any of:
phase change memory;
universal memory;
Ge2Sb2Te5 memory;
programmable metallization cell memory;
resistive memory;
amorphous cell memory;
Ovshinsky memory;
ferroelectric memory;
ferromagnetic memory;
spin transfer torque memory;
spin tunneling memory;
magnetoresistive memory;
magnetic memory;
dielectric memory.

25. The system as in claim 23 further comprising:
read and write buffer means within the pesistent memory controller means to buffer data to be stored in accordance with the memory flush hints.

26. The system as in claim 23 wherein if flush hints are not enabled for the specified address range, then the persistent memory controller means is to save the flushed data to the persistent memory device means.

27. The system as in claim 26 comprising:
memory range register means comprising an enable/disable bit to indicate whether memory flush hints are enabled for a specified system address range, the enable/disable bit having a first value if memory flush hints are enabled and a second value if memory flush hints are not disabled.

28. The system as in claim 27 further comprising:
address indirection table (AIT) means to identify specific persistent memory blocks corresponding to the specified system address range.

29. The system as in claim 28 further comprising:
DIMM memory channel means associated with the system address range.

30. An apparatus, comprising:
a processor having a cache from which data is to be flushed, the data associated with a particular system address range, the processor to determine whether memory flush hints are enabled for the specified system address range, wherein if memory flush hints are enabled for the specified system address range then the processor is to send a memory flush hint to a persistent memory controller of the persistent memory device for the persistent memory controller to use to determine whether to save the flushed data to the persistent memory device.

31. The apparatus of claim 30 wherein the persistent memory is comprised of any of:
phase change memory;
byte-addressable persistent memory;
universal memory;
Ge2Sb2Te5 memory;
programmable metallization cell memory;
resistive memory;
amorphous cell memory;
Ovshinsky memory;
ferroelectric memory;
ferromagnetic memory;
spin transfer torque memory;
spin tunneling memory;
magnetoresistive memory;
magnetic memory;
dielectric memory.

* * * * *